US006841733B2

(12) United States Patent
Schiaffino et al.

(10) Patent No.: US 6,841,733 B2
(45) Date of Patent: Jan. 11, 2005

(54) LASER MONITORING AND CONTROL IN A TRANSMITTER OPTICAL SUBASSEMBLY HAVING A CERAMIC FEEDTHROUGH HEADER ASSEMBLY

(75) Inventors: Stefano Schiaffino, Pleasanton, CA (US); Giorgio Giaretta, Mountain View, CA (US); Patrick Unold, Wolfratshausen (DE); Mina Farr, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/654,692

(22) Filed: Sep. 4, 2003

(65) Prior Publication Data

US 2004/0074661 A1 Apr. 22, 2004

Related U.S. Application Data

(63) Continuation-in-part of application No. 10/625,022, filed on Jul. 23, 2003, which is a continuation-in-part of application No. 10/231,395, filed on Aug. 29, 2002, now Pat. No. 6,703,561, which is a continuation-in-part of application No. 10/077,067, filed on Feb. 14, 2002, now Pat. No. 6,586,678.
(60) Provisional application No. 60/477,868, filed on Jun. 12, 2003.

(51) Int. Cl.[7] .............................................. H01L 23/02
(52) U.S. Cl. ..................... 174/52.5; 174/52.1; 361/714; 361/717
(58) Field of Search ............................... 174/52.1, 52.5, 174/16.3; 361/714, 717; 257/732, 733, 712, 713

(56) References Cited

U.S. PATENT DOCUMENTS

| | | | |
|---|---|---|---|
| 3,987,676 A | 10/1976 | Bennewitz | |
| 4,128,697 A | 12/1978 | Simpson | |
| 4,375,578 A | 3/1983 | Mitchell et al. | |
| 4,769,684 A | 9/1988 | Crocker et al. | |
| 4,820,659 A * | 4/1989 | Dholakia et al. | ............. 438/26 |
| 4,940,855 A * | 7/1990 | Waitl et al. | ................ 174/52.5 |
| 5,212,345 A | 5/1993 | Gutierrez | |
| 5,545,846 A | 8/1996 | Williams et al. | |

* cited by examiner

*Primary Examiner*—Hung V. Ngo
(74) *Attorney, Agent, or Firm*—Workman Nydegger

(57) ABSTRACT

An improved monitoring and control system for a laser in a header assembly of a transmitter optical subassembly ("TOSA") is disclosed. The monitoring and control system, includes one or more monitor photodiodes ("MPDs"), is positioned together with the laser on a component submount. The submount in turn is mated with a multi-layer platform ("MLP") that forms part of the header assembly. The MLP hermetically extends through the header assembly to provide a plurality of electrical interconnects for the laser, MPD(s), and other submount components. In one embodiment, a single MPD is located proximate the laser to receive back facet laser light emission. Measurement of the back facet emission enables the MPD to determine laser intensity. In another embodiment, two MPDs are joined together to receive the back facet laser light emission. Comparison of each MPD's measurement enables the laser's wavelength to be determined and adjusted to optimize its performance.

34 Claims, 15 Drawing Sheets

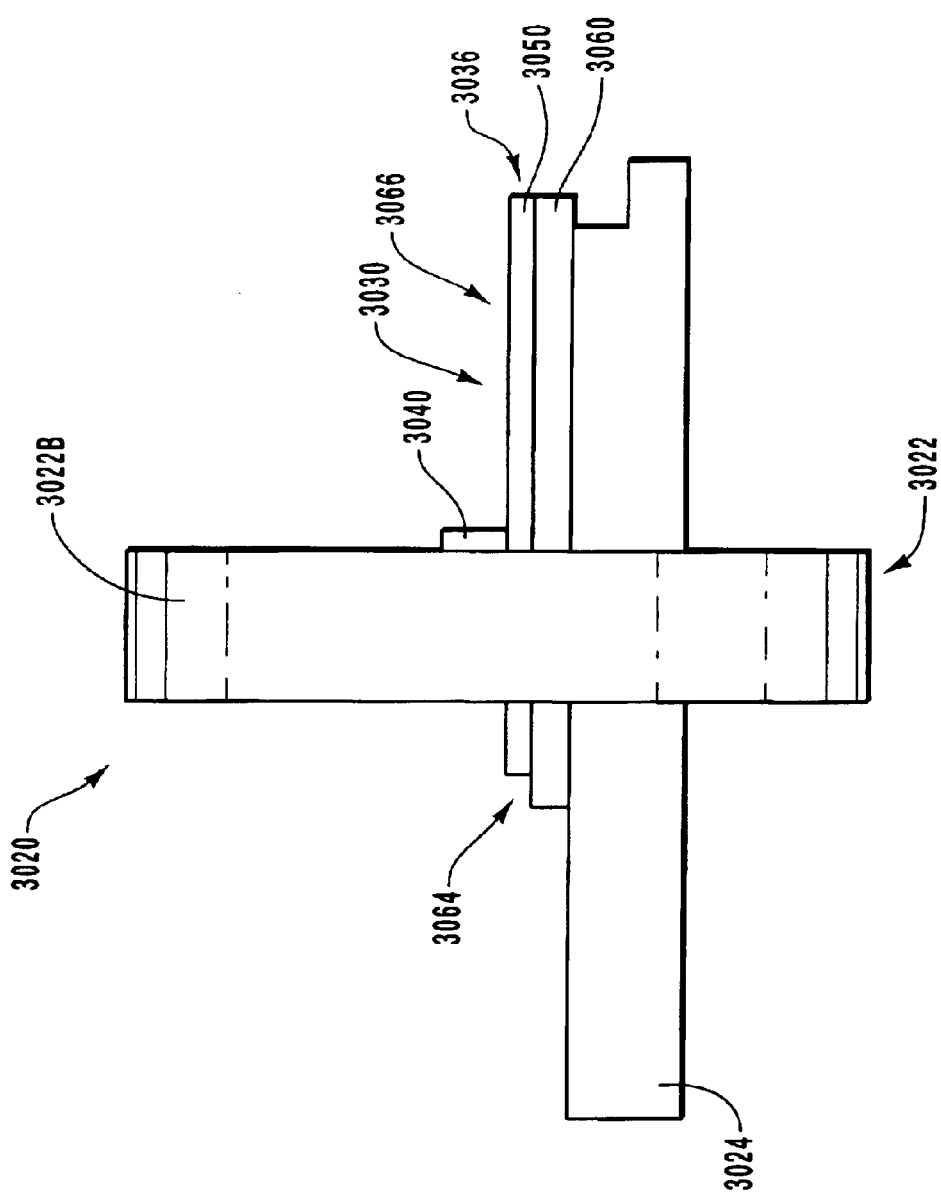

LASER MONITORING AND CONTROL IN A TRANSMITTER OPTICAL SUBASSEMBLY HAVING A CERAMIC FEEDTHROUGH HEADER ASSEMBLY

CROSS-REFERENCE TO RELATED APPLICATIONS

This application claims the benefit of U.S. Provisional Application No. 60/477,868, filed Jun. 12, 2003. This application is also a continuation-in-part of application Ser. No. 10/625,022, filed Jul. 23, 2003. application Ser. No. 10/625,022, is a continuation-in-part of application Ser. No. 10/231,395, filed Aug. 29, 2002 now U.S. Pat. No. 6,703,561, which is a continuation-in-part of application Ser. No. 10/077,067, filed Feb. 14, 2002, now U.S. Pat. No. 6,586,678, entitled "Ceramic Header Assembly." Each of these references is incorporated herein by reference in their entireties.

BACKGROUND OF THE INVENTION

1. The Field of the Invention

The present invention generally relates to optoelectric systems and devices. More specifically, embodiments of the present invention relate to a transistor header assembly for use in an optical transceiver module, wherein the header assembly includes various features directed to monitoring and adjusting a laser device of the transceiver for optimum performance.

2. The Related Technology

Fiber-optic components and opto-electronics have become important components in modem networking circuits. The use of fiber-optic circuits allows for efficient, accurate and quick transmission of data between various components in a network system.

As with the design of most any system, there are engineering tradeoffs that often have to be made when implementing fiber optic systems. For example, the size and modularity of components must often be balanced against the need for additional space to accommodate heat dissipation and circuit monitoring components. While it is desirable to minimize a component's size, some configurations have previously limited this minimization due to their inherent characteristics. For example, previously many lasers used in fiber-optic systems that have the characteristics needed for long-distance transmission and/or dense wavelength division multiplexing (DWDM) generated amounts of heat that could not be dissipated by some smaller package sizes. Further, smaller package sizes have a limited amount of space available for mounting and connecting additional components such as thermistors, monitor photodiodes, thermoelectric coolers, or impedance matching circuits.

Regarding smaller package sizes, it is desirable in fiber optic systems to use modular components so that a system can be created in a compact area and with as little expensive customization as possible. For example, many fiber optic systems are able to use modular transceiver modules. The modular transceiver modules include an input receiver optical subassembly (ROSA) and an output transmitter optical subassembly (TOSA). The ROSA comprises a photodiode for detecting optical signals and sensing circuitry for converting the optical signals to digital signals compatible with other network components. The TOSA comprises a laser for transmitting optical signals and control circuitry for modulating the laser according to an input digital data signal. The TOSA has an optical lens for focusing the light signals from the laser of the TOSA to an optical fiber. Additionally, the transceiver module includes pluggable receptacles for optically connecting the TOSA and the ROSA with other components within a fiber optic network.

The transceiver module often includes an electronic connector for connection to electrical components of the computer or communication device with which the transceiver module operates (a "host system"). The design of the transceiver, as well as other components within the fiber optic system, is standards-based, such that components can be connected without significant customization.

One particular pluggable standard that is currently being developed is the 10-Gigabit Small Form-factor Pluggable (XFP) standard. This standard defines various characteristics such as size, power consumption, connector configuration, etc. With regards to power consumption, the XFP standard references three power consumption levels of 1.5 W, 2.5 W and 3.5 W. When designing devices to operate within the XFP standard, attention must be given to what components are selected and how they are configured so as to not exceed the rated power consumption. These devices are constrained by principles of semiconductor physics to work preferentially in a certain temperature range. The module power dissipation and the package size and materials uniquely determine the module operating temperature for given ambient conditions, such as ambient temperature, airflow, etc. The resulting module operating temperature determines the types of optical and electronic components that can be successfully operated within the package. One such package is known as a transistor-outline header, otherwise known as a TO can or TO.

Transistor-outline headers are widely used in the field of opto-electronics, and may be employed in a variety of applications. As an example, transistor headers are sometimes used to protect sensitive electrical devices, and to electrically connect such devices to components such as printed circuit boards ("PCB").

With respect to their construction, transistor headers often consist of a cylindrical metallic base with a number of conductive leads extending completely through, and generally perpendicular to, the base. With regard to the metallic base, the size of the base is often sized to fit within a specific TO standard size and lead configuration, examples of which include a TO-5 or TO-46. The leads are hermetically sealed in the base to provide mechanical and environmental protection for the components contained in the TO package, and to electrically isolate the conductive leads from the metallic material of the base. Typically, one of the conductive leads is a ground lead that may be electrically connected directly to the base.

Various types of devices are mounted on one side of the base of the header and connected to the leads. Generally, a cap is used to enclose the side of the base where such devices are mounted, so as to form a chamber that helps prevent contamination or damage to those device(s). The specific characteristics of the cap and header generally relate to the application and the particular device being mounted on the base of the header. By way of example, in applications where an optical device is required to be mounted on the header, the cap is at least partially transparent so to allow an optical signal generated by the optical device to be transmitted from the TO package. These optical TO packages are also known as window cans.

Although transistor headers have proven useful, typical configurations nevertheless pose a variety of unresolved problems. Some of such problems relate specifically to the physical configuration and disposition of the conductive leads in the header base. As an example, various factors combine to compromise the ability to precisely control the electrical impedance of the glass/metal feedthrough, that is, the physical bond between the conductive lead and the header base material. One such factor is that there are a relatively limited number of available choices with respect to the diameter of the conductive leads that are to be employed. Further, the range of dielectric values of the sealing glass typically employed in these configurations is relatively small. And, with respect to the disposition of the conductive leads, it has proven relatively difficult in some instances to control the position of the lead with respect to the through hole in the header base.

Yet other problems in the field concern those complex electrical and electronic devices that require many isolated electrical connections to function properly. Typically, attributes such as the size and shape of such devices and their subcomponents are sharply constrained by various form factors, other dimensional requirements, and space limitations within the device. Consistent with such form factors, dimensional requirements, and space limitations, the diameter of a typical header is relatively small and, correspondingly, the number of leads that can be disposed in the base of the header, sometimes referred to as the input/output ("I/O") density, is relatively small as well.

Thus, while the diameter of the header base, and thus the I/O density, may be increased to the extent necessary to ensure conformance with the electrical connection requirements of the associated device, the increase in base diameter is sharply limited, if not foreclosed completely, by the form factors, dimensional requirements, and space limitations associated with the device wherein the transistor header is to be employed.

In connection with the foregoing, another limiting aspect of many transistor headers relates to the relatively limited physical space available on the header. In particular, the relatively small amount of space on the base of the header imposes a practical limit on the number of components that may be mounted thereon. To overcome that limit, some or all of any additional components desired to be used must instead be mounted on the printed circuit board, some distance away from the laser or other device contained within the transistor header. Such arrangements are not without their shortcomings however, as the performance of active devices in the transistor header, such as lasers and integrated circuits, depends to some extent on the physical proximity of related electrical and electronic components. By minimizing the distance between the lasers and integrated circuits to the additional components required for impedance matching, the inherent transmission line between such components is minimized. As such, placing the components in close physical proximity reduces reflective transmission line losses.

In addition to the above, further challenges are faced when certain functions are desired to be added to the transistor header. In particular, it is beneficial to monitor and/or modify the character of the optical signal that is produced and emitted by the laser device of the TOSA. For instance, the optical signal that is output by the laser device can change in power and/or wavelength over time as the laser heats up within the TOSA during operation of the optical transceiver module. If these laser parameters are actively monitored during transceiver operation, adjustment can be made to the laser device to ensure its proper operation.

Monitoring of laser device parameters such as power and output wavelength is typically accomplished using one or more monitor photodiodes ("MPD"). In the case of laser power monitoring, a single MPD is often used, while wavelength monitoring typically requires two MPDS working in concert. In either case, it is desirable to locate the one or more MPDs within the transistor header assembly in close proximity to the laser device so that laser light produced by the laser device can be received by the MPDs. However, as has already been explained, the location of optoelectronic devices within the transistor header assembly requires additional electrical interconnects to be passed through the header assembly, which may not be possible in known header assembly designs that must comply with prescribed dimensional form factors. Thus, the use of one or more MPDs within a transistor header assembly may be restricted or foreclosed completely.

In light of the above discussion, a need exists for a transistor header design for use within an optical transceiver module that overcomes the above challenges. In particular, a transistor header is needed that enables a relatively greater number of interconnects to be established between the header interior and devices located outside of the header. Such a solution should also enable the utilization of monitoring devices, such as one or more monitor photodiodes, within the transistor header assembly to optimize the operation of optoelectronic components, such as a laser device, located therein.

BRIEF SUMMARY OF THE INVENTION

The present invention has been developed in response to the above and other needs in the art. Briefly summarized, embodiments of the present invention are directed to a transistor header assembly that includes various features directed to enhancing the reliability and performance of various optoelectronic devices, such as a laser, that are located within the header assembly. In particular, presently preferred embodiments include a header assembly that enables the incorporation therein of one or more monitoring devices, such as a monitor photodiode, in order to optimize operation of the laser. This is accomplished while concurrently preserving the size of the header assembly within predefined form factor restrictions.

In one illustrative embodiment of the invention, a transistor header is disclosed having a platform extending through a base of the header. The platform includes multiple stacked layers, wherein each layer defines a plurality of specified conductive pathways that extend through the header base to interconnect optoelectronic devices disposed on a portion of the platform inside the header with other components disposed outside of the header. The multi-layer design of the platform allows not only for a relative increase in the number of interconnects available for use within the header, but also for the electrical isolation of the conductive pathways from other portions of the header assembly to enable their passage from the exterior portion to the interior portion thereof.

The multi-layer platform further enables specialized components to be positioned within the header assembly to enhance its operation. Such components include, for example, EML laser device configurations and thermoelectric coolers. Particularly, in one presently preferred embodiment the multi-layer platform provides for the placement of one or more monitor photodiodes within the header assembly to monitor the operation of the laser device. Parameters of the laser that can be monitored and/or controlled by the monitor photodiode(s) include the power and wavelength of the optical signal that is emitted by the laser.

To monitor laser power, a single monitor photodiode ("MPD") is located within the header assembly on a submount that is operably attached to the multi-layer platform. The MPD is positioned in close proximity to a laser, such as a distributed feedback laser, that is also located on the submount. Back emission of light from the laser is received by the MPD, which then determines the power of the laser output. Adjustments to the laser can then be made based on the measurement of the MPD in order to optimize laser operation.

To monitor laser wavelength, two MPDs (which together operate as a wavelength locker) are located on the submount in close proximity to the laser. Back emission of light from the laser is received by both MPDs, one of which includes a wavelength-dependent filter. Each MPD produces a measurement signal according to the laser light received thereby, with the strength of the measurement signal of the filtered MPD varying according to the wavelength of the light received from the laser. A ratio comparison of the two measurement signals produced by the respective MPDs yields the wavelength of the optical signal being produced by the laser. In this way, any needed modification of the optical signal output of the laser can be determined and performed to optimize the quality of the signal.

In either of the two cases above (i.e., single or double MPDs), multiple electrical interconnects passing through the header assembly are needed in order to provide the necessary electrical connectivity of the MPDs. In accordance with the present invention, these interconnects are readily provided by virtue of the multi-layer platform design as disclosed herein, which design provides multiple interconnects between exterior and interior portions of the header assembly without compromising the size restrictions of the header assembly. This ultimately results in enhanced performance not only for the header assembly and optoelectronic components disposed therein, but for the optical subassembly containing the header assembly, and the optical transceiver as a whole. Alternatively, the header assembly can be employed in other electronic package configurations, such as transmitters, receivers, transponders, etc.

These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 5B is a side view of the header assembly of FIG. 5A;

DETAILED DESCRIPTION OF THE PREFERRED EMBODIMENTS

Reference will now be made to figures wherein like structures will be provided with like reference designations. It is understood that the drawings are diagrammatic and schematic representations of presently preferred embodiments of the invention, and are not limiting of the present invention nor are they necessarily drawn to scale.

FIGS. 1-13 depict various features of embodiments of the present invention, which is generally directed to an improved header assembly that permits enhanced functionality of components disposed therein. In particular, various embodiments of the present invention disclose a multi-layer feedthrough structure that is integrated with the header assembly for use in small form factor optical transceiver modules. The multi-layer configuration of the feedthrough enables a significant expansion of both the number and types of electro-optic components that can be positioned within the header assembly. Indeed, in presently preferred embodiments, one or more monitor photodiodes are located within the header assembly to monitor various parameters of a laser device. Both the monitor photodiode(s) and the laser device are located on a component submount, which is in turn electrically connected to the multi-layer platform. Because of the relatively high number of electrical interconnects provided by the multi-layer platform, the inclusion of one or more photodiodes within the header assembly to operate in conjunction with the laser device is facilitated. This in turn results in enhanced flexibility in transceiver design as well as in improved control thereof.

In particular, the monitor photodiodes can be mounted such that light emitted from a back facet of the laser is detected. Using light emitted from the back facet, the monitor photodiode can monitor the power of the laser.

Similarly, a wavelength locker (comprising, in one embodiment, multiple monitor photodiodes) can use light emitted from the back facet to monitor the wavelength and/or power of the laser. The multi-layer configuration of the feedthrough provides sufficient electrical interconnects to permit monitor photodiodes or other devices to be located near the laser.

In one embodiment, the header assembly of the present invention is configured for use within optical transceiver modules adhering to the XFP standard. At the time of the filing of this patent application, the XFP standard is the XFP Adopted Revision 3.1, promulgated by the 10 Gigabit Small Form Factor Pluggable (XFP) Multi Source Agreement (MSA) Group. This XFP Adopted Revision 3.1 document is incorporated herein by reference. As used herein, the terms "XFP standard" and "XFP Multi Source Agreement" refer to the Adopted Revision 3.1. These terms also refer to any subsequent drafts or final agreements to the extent that any such subsequent drafts or final agreements are compatible with Adopted Revision 3.1.

1. Header Assemblies

Figure 1A:
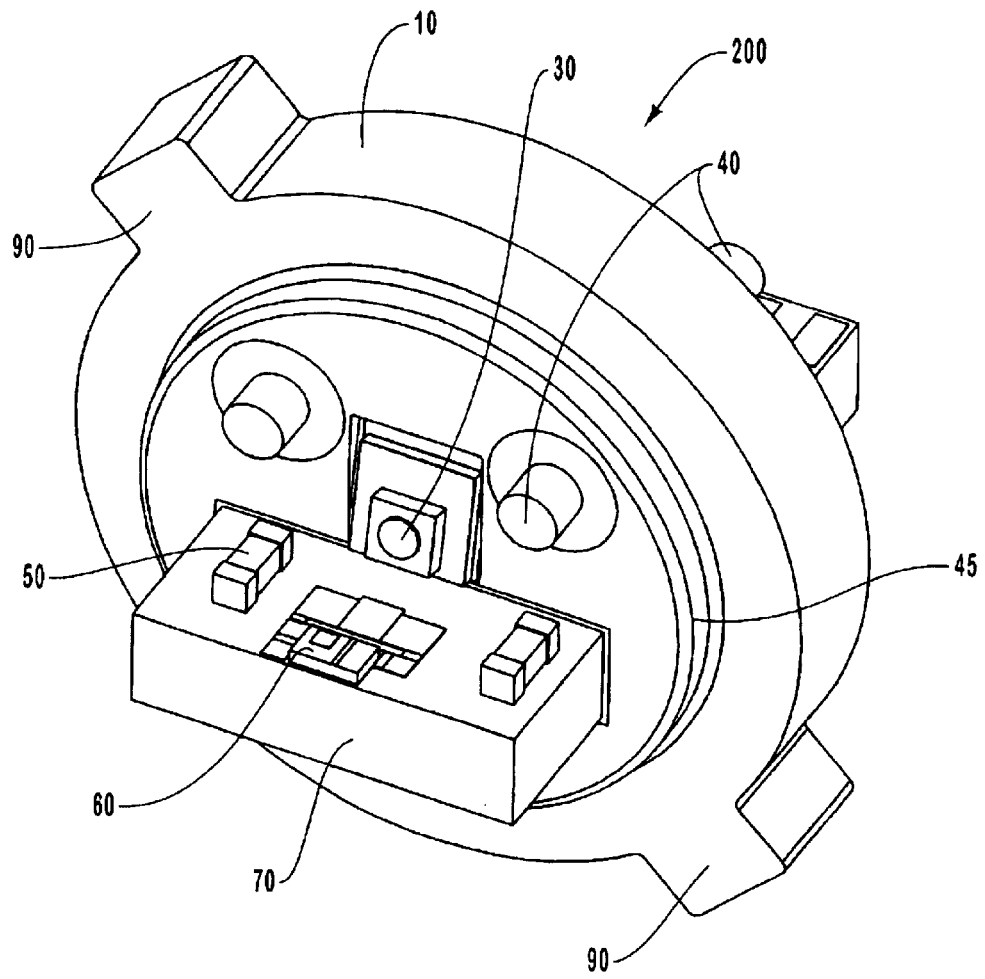
FIG. 1A is a perspective view illustrating various aspects of the device side of an exemplary embodiment of a header assembly.
Figure 1B:
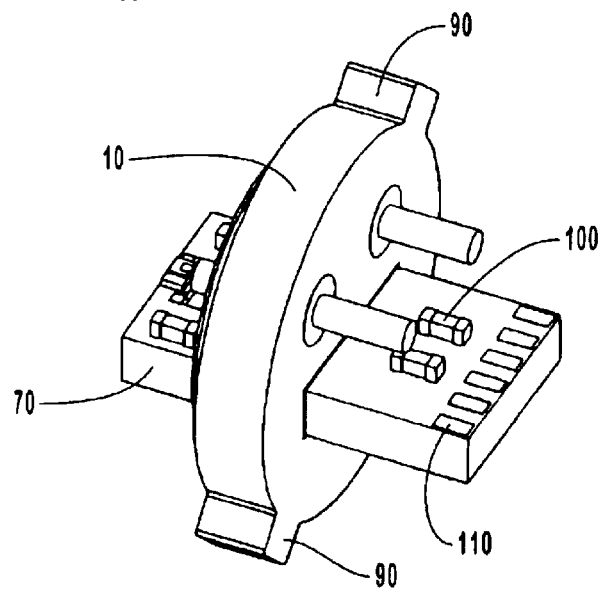
FIG. 1B is a perspective view illustrating various aspects of the connector side of an exemplary embodiment of a header assembly.

Reference is first made to FIGS. 1A and 1B together, which illustrate perspective views of one presently preferred embodiment of a header assembly, designated generally at 200. In the illustrated example, the header assembly 200 includes a substantially cylindrical metallic base 10. The base 10 includes two flanges 90 for releasably securing the header 200 to a receptacle (not shown) on a higher level opto-mechanical assembly. The base can be formed of Alloy 42, which is an iron nickel alloy, as well as cold-rolled steel, Vacon VCF-25 Alloy, Kovar, or other suitable material. The base 10 also includes a ceramic platform 70 extending perpendicularly through the base as shown. The ceramic platform is hermetically sealed to the base to provide mechanical and environmental protection for the components contained in the TO package. Ceramic materials may include, but are not limited to, alumina ($Al_2O_3$) or aluminum nitride (AlN).

The hermetic seal between the base 10 and the platform 70 is created by electrically insulating glass-to-metal seals. Alternatively, the platform 70 may incorporate two additional ceramic outer layers to electrically isolate the outermost conductors. In this second case, a metal braze or solder can be used to hermetically seal the platform 70 to the metal base. This solution overcomes the principal shortcomings of glasses, namely their low strength, brittleness, and low thermal conductivity.

The platform 70 is structured to house multiple electrical components 50 and 100, and active devices 60 on either side of the base. In the illustrated embodiment, the active device 60 comprises a semiconductor laser, and the components 50 and 100 may include resistors, capacitors, and inductors that are used to balance the driving impedance of the laser with the component impedance. As discussed in more detail below, impedance matching circuits may also be created by etching electrical traces that have various capacitive, inductive or resistive properties, on platform 70. In addition to matching, components may have peripheral functions such as measuring temperature, sensing laser optical power or wavelength, etc. As it is important for a semiconductor laser to be precisely positioned perpendicularly to the base 10, platform 70 is, therefore, precisely positioned perpendicularly with respect to the base 10.

Where active device 60 comprises a semiconductor laser, a small deviation in the position of active device 60, in relation to base 10 can cause a large deviation in the direction of the emitted laser beam. Accurate perpendicularity between the platform and the base can be achieved by incorporating a vertical pedestal feature in the base material, as shown on FIG. 1A. The vertical pedestal houses the photodiode 30 in the embodiment shown in FIG. 1A. Such feature can be machined, stamped, or metal injection molded directly with the base thus providing a stable and geometrically accurate surface for mating with the platform.

The platform 70 further includes multiple electrically isolated conductive pathways 110 extending throughout the platform 70 and consequently through the base 10. The conductive pathways 110 provide the electrical connections necessary between electrical devices or components located throughout the platform 70. The conductive pathways 110 form a connector on that side of the base that does not include the semiconductor laser 60, also referred to herein as the "connector side" of the base. Note in connection with the foregoing that the side of the base where the active device 60 is located may in some instances be referred to herein as the "device side" of the base.

The connector formed by the conductive pathways 110 is used to electrically connect the header assembly 200 to a second electrical subassembly, such as a printed circuit board, either directly (for example, by solder connection) or indirectly by an intermediary device such as a flexible printed circuit. The semiconductor laser 60 is electrically connected to the electrical components 50 and 100 via the conductive pathways 110.

The platform 70 may also comprise multiple layers wherein each layer may have a conductive layer with various conductive pathways 110. In this way numerous conductive pathways 110 may be constructed for use with various components disposed on the platform 70. Generally, the layers are electrically isolated from one another, however various conductive pathways 110 on different layers may be connected by a via such as is commonly known in printed circuit board arts.

Further, the conductive pathways 110 can be shaped and placed such that they have controlled capacitive, inductive, or resistive effects to create waveguides such as a microstrip or stripline (cpw, etc.). For example, knowing certain characteristics about the materials used in making the conductive pathways 110 and the materials of the various layers of the platform 70, passive electrical devices can be constructed by appropriately configuring the conductive pathways 110. In this way, a transmission line with known characteristics can be created for use with active devices 60 attached to the platform 70. As noted above, by matching the characteristics of the transmission line connected to active devices 60 with the active devices' 60 load impedance, electrical reflections that cause transmission errors and lower power output can be reduced or in many cases eliminated.

By constructing a transmission line that matches active device 60 impedance on the platform 70 from the conductive traces 110, the need to add additional discrete matching components is eliminated often resulting in better overall circuit performance. In fact, previously due to the lack of adequate matching circuits, applications involving transistor headers have been limited to 10 Gb/s. With the improvements of using a transmission line constructed on the platform 70, applications up to 40 Gb/s or more can be implemented.

While the preceding description has discussed active devices 60 in terms of lasers, it should be noted that the transmission lines may also be formed such that a matching circuit for other semiconductor devices is constructed. For example, the transmission lines may be used to connect directly to a laser, such as in the case of DFB lasers. Alternately, the transmission lines may be used to connect to an EA modulator, for example, such as in the case of EMLs that incorporate a DFB laser and an EA modulator. As discussed herein, the impedance values of the impedance matching transmission lines depend on the load impedance of the active devices attached to the platform 70.

External components, while still useful, are not ideal for impedance matching because they often represent an additional load that must be driven by the power supply driving the electronic component, such as when resistors are used to match the active device 60 load impedance. Additionally, although the external components may be placed reasonably close to the active devices 60, there is always some small distance between the external components and the active devices 60 that acts as an unmatched transmission line.

The use of advanced ceramic materials, examples of which include aluminum nitride and beryllia, allows the header assembly 200 to achieve substantially lower thermal resistances between the devices inside the package and the outside world where heat is ultimately transferred. As discussed in further detail below in the context of an alternative embodiment of the invention, a cooling device, such as a thermoelectric cooler ("TEC"), a heat pipe or a metal heat spreader, can be mounted directly on the platform, thereby providing for a very short thermal path between the temperature sensitive devices on the platform and a heat sink located outside the header assembly.

As is further shown in FIGS. 1A and 1B, the header assembly 200 additionally includes two conductive leads 40 extending through and out both sides of the base 10. The conductive leads 40 are hermetically sealed to the base 10 to provide mechanical and environmental protection for the components contained in the TO package between the conductive leads 40 and the base 10. The hermetic seal between the conductive leads 40 and the base 10 is created, for example, by glass or other comparable hermetic insulating materials that are known in the art. The conductive leads 40 can also be used to electrically connect devices and/or components located on opposite sides of the base.

In the illustrated embodiment at least, the conductive leads 40 extend out from the side of the base 10 that does not contain the semiconductor laser 60, in a manner that allows for the electrical connection of the header assembly 200 with a specific header receptacle located on, for example, a printed circuit board. It is important to note that conductive pathways 110 and conductive leads 40 perform the same function and that the number of potential conductive pathways 110 is far greater than the potential number of conductive leads 40. Alternative embodiments can incorporate even more conductive pathways 110 than shown in the illustrated embodiment.

The platform 70 further includes steps and recessed areas that permit mounting devices with various thicknesses flush with the metal pads on the ceramic. This allows the use of the shortest electrical interconnects, wire bonds for example, having improved electrical performance and characteristics. This also provides optical benefits by, for example, aligning the active region of a laser mounted on the platform with the optical axis of the package.

The photodiode 30 is used to detect the signal strength of the semiconductor laser 60 and relay this information back to control circuitry of the semiconductor laser 60. In the illustrated embodiment, the photodiode can be directly connected to the conductive leads 40. Alternatively, the photodiode can be mounted directly onto the same platform as the laser, in a recessed position with respect to the light emitting area. This recessed position allows the photodiode to capture a fraction of the light emitted by the laser, thus allowing the photodiode to perform the same monitoring function.

This configuration of the monitoring photodiode allows for eliminating the need of conductive leads 40, and lends itself to simplified electrical connections, such as wire bonds, to the conductive pathways 110 of the platform 70. In an alternative embodiment, the photodiode light gathering can be increased by positioning an optical element on the base for focusing or redirecting light, such as a mirror, or by directly shaping and/or coating the base metal to focus additional light onto the photodiode.

As is further shown in FIG. 1A, the base 10 includes a protruding portion 45 that is configured to releasably position or locate a cap (not shown) over one side of the base 10. A cap can be placed over the side of the base 10 containing the semiconductor laser 60 for the purpose of protecting the semiconductor laser 60 from potentially destructive particles. A transparent cap is preferable for the illustrated embodiment so as to allow the laser light to escape the region between the cap and the base 10.

Figure 2A:
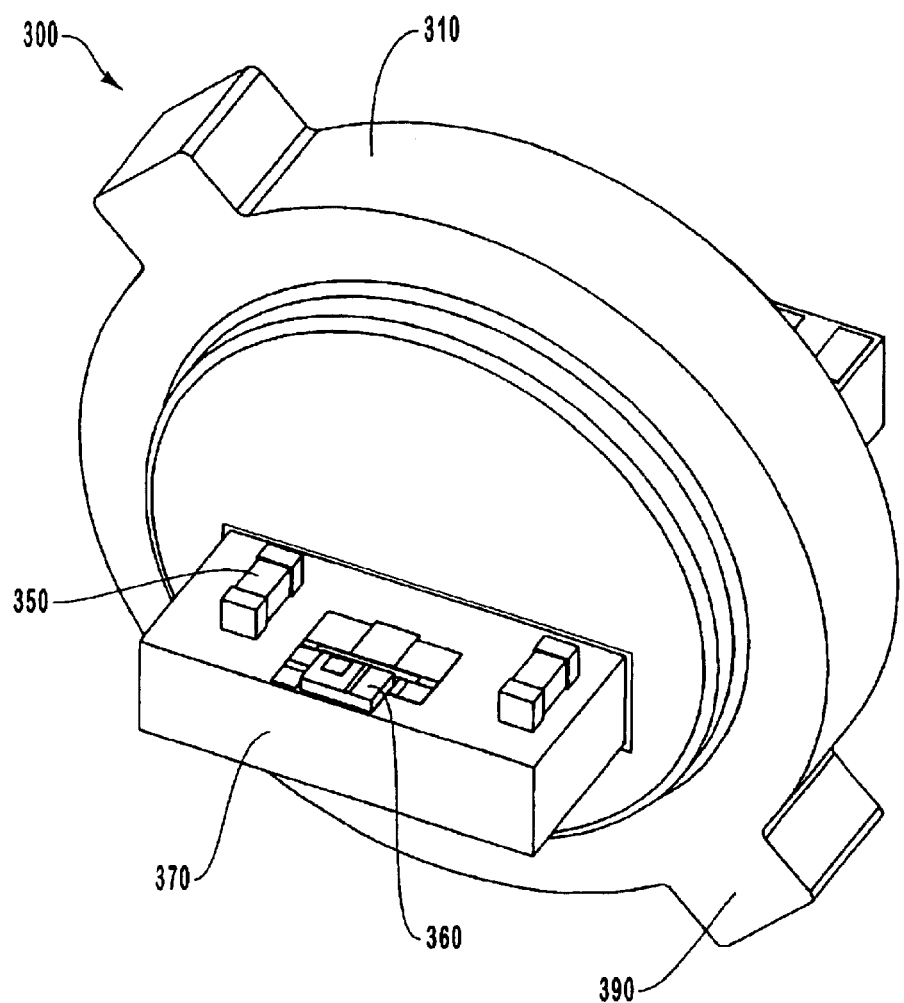
FIG. 2A is a perspective view illustrating various aspects of the device side of an alternative embodiment of a header assembly.
Figure 2B:
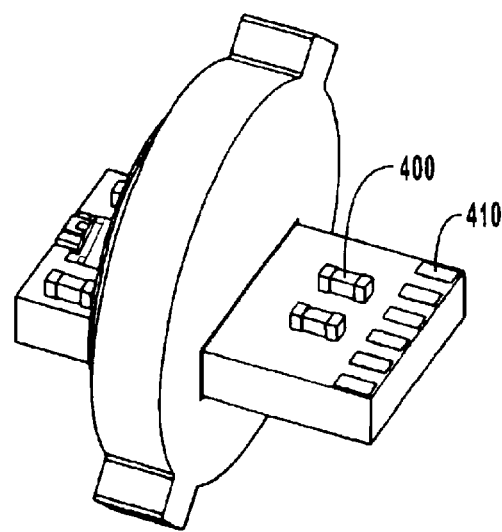
FIG. 2B is a perspective view illustrating various aspects of the connector side of an alternative embodiment of a header assembly.

Reference is next made to FIGS. 2A and 2B, which illustrate perspective views of an alternative embodiment of a header assembly, designated generally at 300. This alternative embodiment shows an optical receiver 360 mounted horizontally on the platform 370 perpendicularly bisecting the base 310 of the header assembly 300. The optical receiver can be a photodetector or any other device capable of receiving optical signals. The optical receiver 360 is mounted flat on the platform 370 and detects light signals through the side facing away from the base 310. This type of optical receiver is sometimes referred to as an "edge detecting" detector. The base 310 and platform 370 are described in more detail with reference to FIGS. 1A and 1B. The platform 370 contains electrical components 350, 400 on either side of the base for operating the optical receiver 360. The platform 370 also includes conductive pathways 410 for electrically connecting devices or components on either side of the base 310. This embodiment of a header assembly does not contain conductive leads and therefore all electrical connections are made via the conductive pathways 410.

Figure 3A:
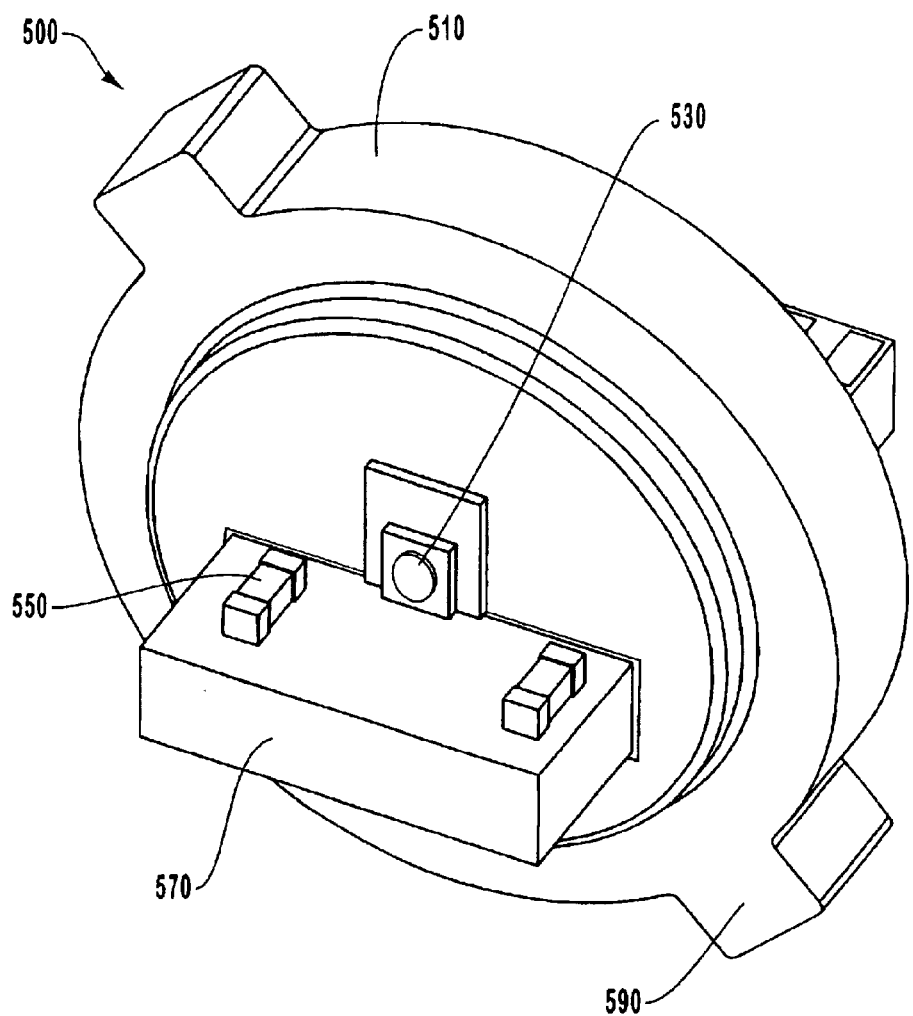
FIG. 3A is a perspective view illustrating various aspects of the device side of another alternative embodiment of a header assembly.
Figure 3B:
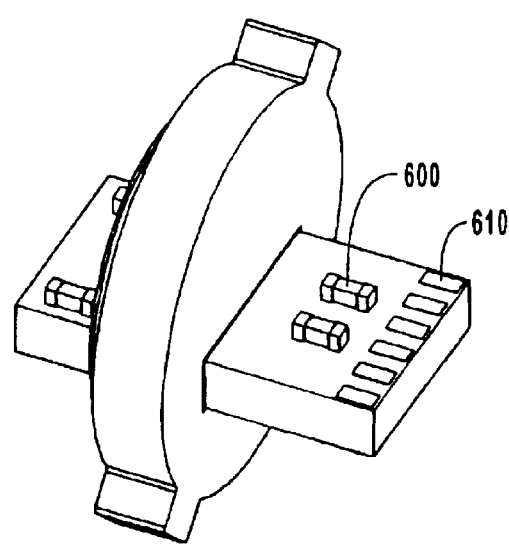
FIG. 3B is a perspective view illustrating various aspects of the connector side of another alternative embodiment of a header assembly.

Reference is next made to FIGS. 3A and 3B, which illustrate perspective views of yet another alternative embodiment of a header assembly, designated generally at 500. This alternative embodiment also shows an optical receiver 530 mounted vertically on the base 510. The optical receiver can be a photodetector or any other device capable of receiving optical signals. This is an optical receiver 530 which detects light signals from the top of the device. The base 510 and platform 570 are described in more detail with reference to FIGS. 1A and 1B. The platform 570 contains electrical components 550, 600 on either side of the base for operating the optical receiver 530. The platform 570 also includes conductive pathways 510 for electrically connecting devices or components on either side of the base 510. This embodiment of a header assembly does not contain conductive leads and therefore all electrical connections are made via the conductive pathways 410.

In other embodiments of the invention, the optical receiver 360 or optical receiver 530 is an avalanche photodiode (APD). Generally, APDs represent a good choice for an optical receiver because they have good noise and gain characteristics. Specifically, the wide gain bandwidth product of APDs allows for more versatility in design such that noise can be reduced and transmission distances increased. Unlike the transmitter designs disclosed herein, these receivers often include active semiconductor integrated circuits mounted next to the receiver pin diode or APD, generally in the form of a transimpedance amplifier (TIA) or a TIA with a limiting amplifier (TIALA).

2. Multi-Layer Ceramic Feedthrough Structure

Figure 4:
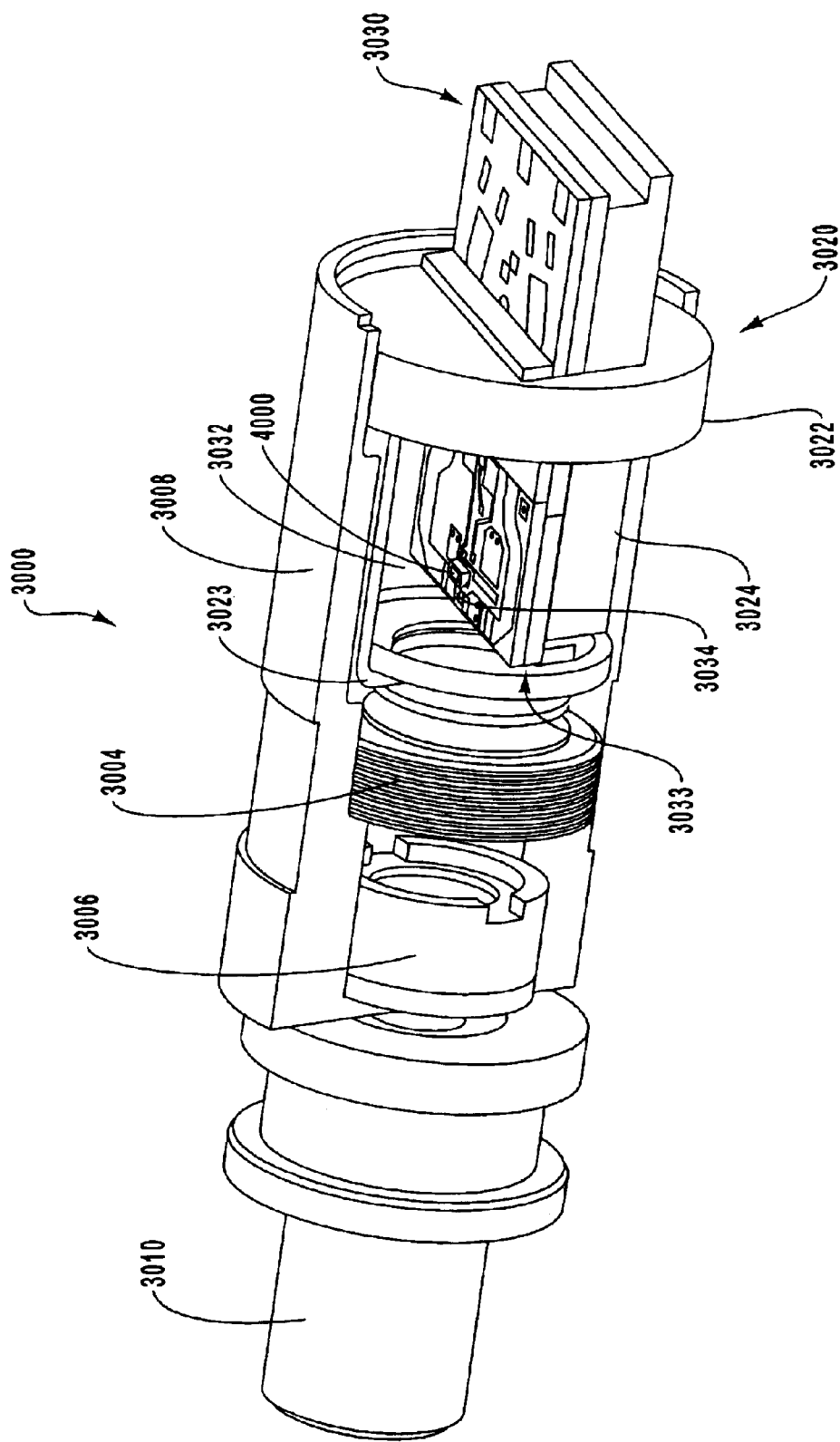
FIG. 4 is a perspective view of a transmitter optical subassembly having a header assembly configured in accordance with another embodiment of the present invention.

Reference is now made to FIG. 4, depicting various details of a transmitter optical subassembly ("TOSA") 3000. The TOSA 3000 as shown in FIG. 4 is configured for use within an optical transceiver module (not shown) that is capable of producing a modulated optical signal for transmission via an appropriate waveguide, such as a fiber optic cable. Such optical signals are used, for instance, in optical communications networks for high speed transmission of data, as has been discussed.

The TOSA 3000 generally comprises various components, including a lens assembly 3004, an isolator 3006, an outer casing 3008, and a receptacle 3010. These components cooperate to house and condition an optical signal produced within the TOSA 3000 for emission via a connectorized fiber optic cable (not shown) that attaches to the receptacle 3010. A short description of several of these components follows.

The collimating lens assembly 3004 is optically coupled to a laser diode 3034. The collimating lens assembly 3004 may be any suitable combination of lenses adapted to focus light from the laser 3034 such that the light can be further propagated in a fiber optic network. In a receiver application when a photo diode is used, the collimating lens assembly 2104 is adapted to focus light from the fiber optic network onto the photo diode.

The isolator 3006 is adapted to prevent back reflection of light into the laser diode 3034. Back-reflections are generally caused when light travels from a medium having a first index of refraction into a medium with a second, different index of refraction. Reflections back into a laser look like another cavity of the laser other than the primary, and destabilize the amplitude and wavelength of the laser light. Certain standards have been developed that specify acceptable amounts of back-reflection. For example, SONET specifications require that a receiver have a back-reflection ratio no greater than −27 dB. Other techniques can be used at the receiver to reduce optical return loss or back reflections, including a variety of index matching and anti-reflection techniques, such as a combination of fiber stubs, angle polished fibers or stubs, anti-reflection coatings, and glass plates.

The receptacle 3010 is optically coupled to the isolator 3006. The receptacle is adapted to couple to other fiber-optic devices in a pluggable manner. In one embodiment of the invention, the TOSA 3000 complies with the XFP form factor and, correspondingly, the receptacle 3010 is also configured to comply with the XFP standard receptacle size for implementation in an XFP system, which is an LC fiber-optic cable receptacle. Other common receptacles are the SC and FC connectors. Note that the TOSA 3000 can comply with other form factor sizes, such as GBIC and SFP while still enabling the functionality described herein.

The TOSA 3000 further includes a header assembly, generally designated at 3020, that provides multiple functions for the TOSA 3000. First, the header assembly 3020 supports a component platform, or submount, on which optoelectronic devices can be positioned. Additionally, the header assembly 3020 includes a multi-layer platform structure that serves as an interconnect to enable the transfer of electrical signals to and from the optoelectronic components located on the submount. (As used herein, the term "electrical signals" is meant to include at least electrical, electrostatic, and/or electromagnetic signals.) Further, the header assembly 3020 can enable cooling and/or heating of specified TOSA components in order to optimize operation of components located on the component platform, as well as TOSA operation as a whole.

In accordance with embodiments of the present invention, the multi-layer platform that forms a part of the header assembly and that will be discussed in greater detail below, enables inclusion within the header assembly of specified optoelectronic components that substantially enhance the operation of the TOSA. Indeed, in one embodiment, one or more optical receivers are included within the header assembly to monitor and optimize and optical signal produced by a laser within the TOSA, thereby improving TOSA operation within an optical transceiver module. Attention will now be directed to certain aspects of the header assembly and multi-layer platform, with discussion of the incorporation of optical receivers therewith to follow thereafter.

Figure 5A:
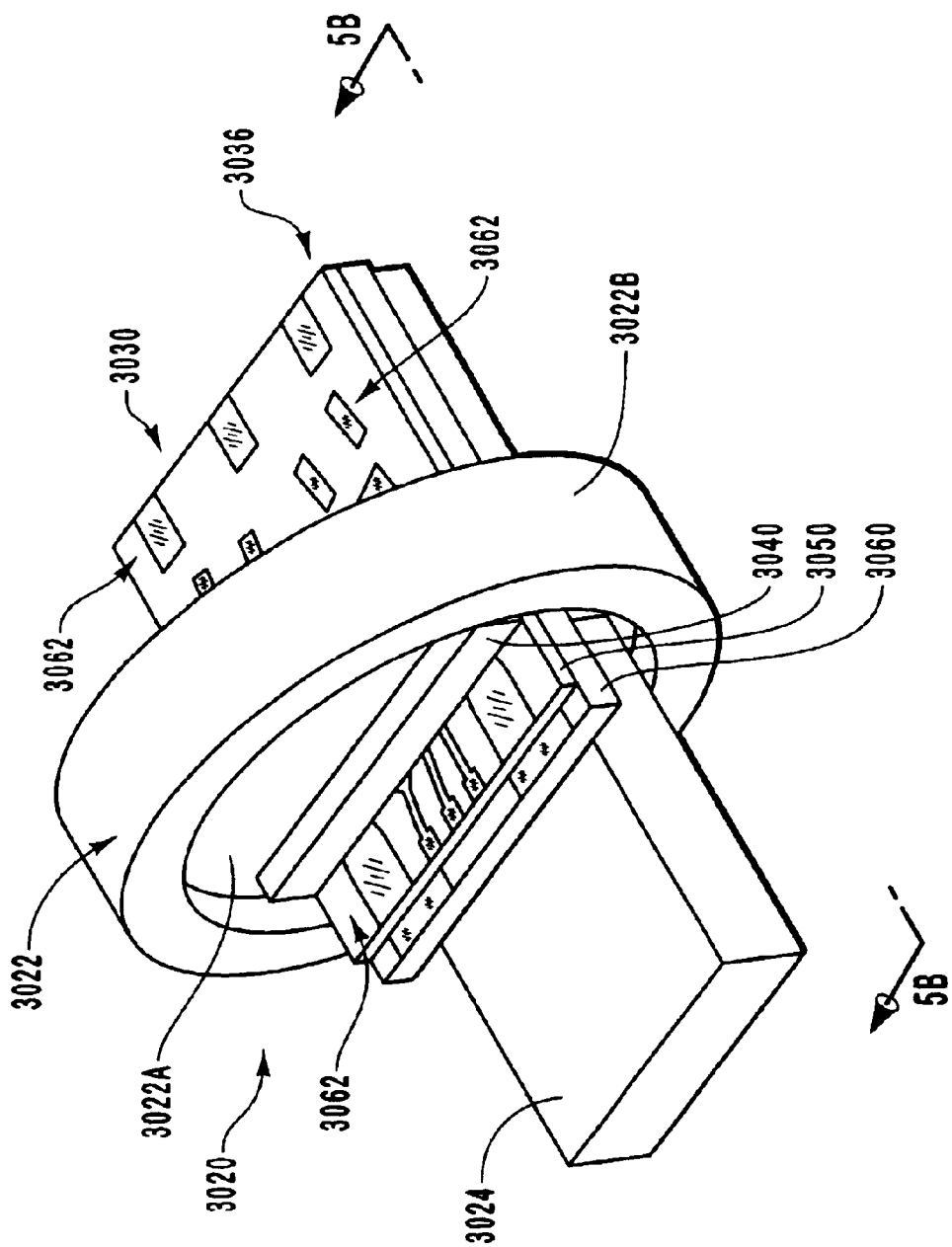
FIG. 5A is a perspective view of the header assembly comprising part of the transmitter optical subassembly shown in FIG. 4.

With continuing attention to FIG. 4, reference is now made to FIGS. 5A and 5B, which show perspective and side views, respectively, of portions of the exemplary header assembly 3020. As seen in these figures, the header assembly 3020 generally comprises several components including a base 3022, a cap 3023 (FIG. 4), a thermal slug 3024, and a multi-layer platform ("MLP"), designated generally at 3030. Details of each of these components, as well as their interrelationship, are given below.

As shown in FIGS. 4, 5A, and 5B, the base 3022 of the header assembly 3020 comprises a disk portion 3022A and a circumferential flange 3022B. The disk portion 3022A and the flange 3022B can be hermetically joined to one another, or integrally formed as a unitary piece. Together with the cap 3023 that mechanically attaches to the flange 3022B, the base 3022 forms a hermetic enclosure 3032 in which various components of the header assembly 3020, such as the laser 3034 (FIG. 4), can be positioned. An optically transmissive window is typically included in the cap to allow the passage of optical signals produced by a laser located within the hermetic enclosure 3032. As has been described, these components are typically used either directly or indirectly during the operation of the TOSA 3000 to produce a modulated optical signal that can be emitted from an optical transceiver module (not shown) in which the TOSA is disposed. The disk portion 3022A of the base 3022 is preferably made of Kovar, a metallic material having a desirable coefficient of thermal expansion that facilitates the hermetic attachment of the MLP 3030 to the base, as will be seen. Of course, the particular size, shape, configuration, and composition of the base 3022, the cap 3023, and the hermetic enclosure 3032 formed thereby can vary in accordance with the designated application. For instance, in one embodiment the disk portion 3022A of the base 3022 can be made from a copper-tungsten alloy, if desired.

The MLP 3030 is shown extending through an aperture defined in the disk portion 3022A of the base 3022. The thermal slug 3024 is also shown extending through the disk aperture, adjacent the MLP 3030. As best seen in FIG. 5B the MLP 3030, as its name implies, is comprised of multiple stacked platform layers 3036 that are joined to form the MLP. Particularly, in the illustrated embodiment the MLP 3030 includes three platform layers: an upper insulating layer 3040, an intermediate layer 3050, and a lower layer

3060. These layers 3036 are arranged in the stacked configuration shown in FIGS. 5A and 5B and are hermetically sealed together. The layers 3036 are also located atop and, in one embodiment, hermetically attached to the thermal slug 3024. Each layer further includes a plurality of electrically conductive pathways 3062 defined on the surfaces of the various layers 3036. As will be seen, the arrangement of conductive pathways in this manner enables a relatively greater number of input/output interconnects to connect with the header assembly 3020. Note that, while the MLP 3030 includes a plurality of stacked layers having conductive pathways, in other embodiments a single-layer platform can be employed to facilitate laser monitoring and control in accordance with the present invention. Thus, the description of a multi-layer MLP as discussed herein is not limiting of the present invention.

Because of the extension of the MLP 3030 hermetically through the base 3022, it is useful to define the portion of the MLP that extends into the hermetic enclosure 3032 (see FIG. 4) as an interior portion 3064 of the MLP and the MLP portion extending away from the base on the exterior of the hermetic enclosure as an exterior portion 3066 of the MLP. This exterior portion/interior portion convention applies and extends to each layer 3036 of the MLP 3030. In accordance with principles of the present invention, and as will be discussed below, the stacked arrangement of the layers 3036, together with the specified configuration of the conductive pathways 3062 defined thereon, enables a relatively greater number of electrical interconnects to be introduced into hermetic enclosure 3032 of the header assembly 3020. This, in turn, desirably allows for the enhanced selection, placement, and operation of optoelectronic components within the hermetic enclosure 3032, as will be seen further below, thereby representing an advantage over less robustly configured header assemblies. Additionally, the increased number of interconnects provided in the header assembly comes without the need for increasing the size of the TOSA package.

Each of the layers 3036 of the MLP 3030 is preferably formed of an insulative material. In the illustrated embodiment, each of the layers 3036 is composed of a co-fired ceramic material, such as alumina or aluminum nitride. Notwithstanding, other materials, such as aluminum nitrate, beryllium oxide, or other insulative ceramic and non-ceramic materials could also be acceptably employed. Further details concerning the structure and configuration of each of the layers 3036 of the MLP 3030 are given below in connection with FIGS. 7 and 8.

Figure 6A:
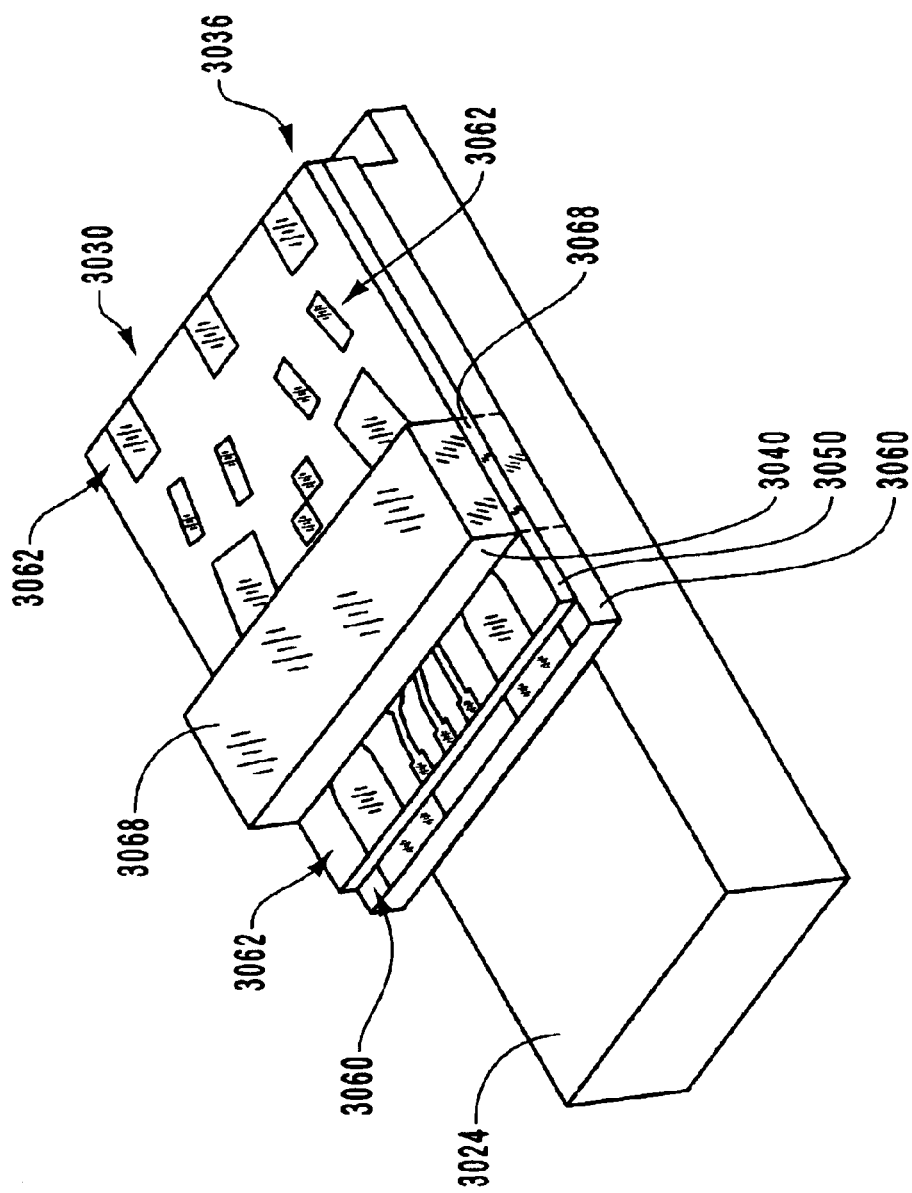
FIG. 6A is a perspective view of the header assembly of FIG. 5A with the circular base removed.
Figure 6B:
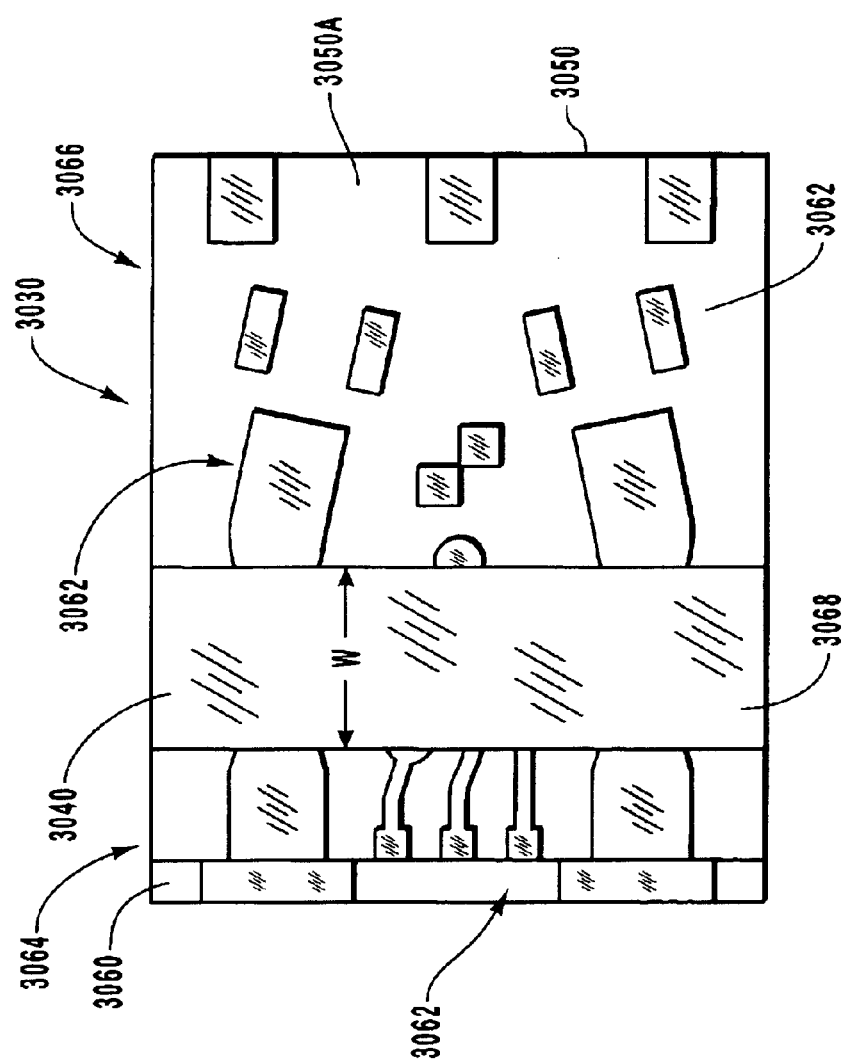
FIG. 6B is a top view of the header assembly of FIG. 6A.

Reference is now made to FIGS. 6A and 6B, which depict various views of the MLP 3030 as separated from the base 3022 of the header assembly 3020. In these views the relative sizes and respective placement of each of the layers 3036 and conductive pathways 3062 of the MLP 3030 is more clearly shown. As illustrated, the upper insulating layer 3040 includes a relatively short slab of ceramic material that spans the overall width of MLP 3030. The upper insulating layer 3040 has a width "w" that is slightly greater than the thickness of the disk portion 3022A of the base 3022. As will be explained in greater detail below, this width is sufficient to allow the upper layer 3040 to electrically isolate the conductive pathways 3062 located on the surface of the intermediate layer 3050 (positioned below the upper layer) from the base 3022, which is preferably formed of an electrically conductive metal. Though shown in the figures as being relatively thick with respect to the layers 3050 and 3060, the upper layer 3040 can have one of a variety of thicknesses according to the need for electrical isolation and the space requirements of the header assembly 3020.

As mentioned above, the base 3022—especially the disk portion 3022A—can be composed of Kovar, copper-tungsten, or another suitable material that possesses a coefficient of thermal expansion that is substantially similar to that of the ceramic from which the layers 3036 are made. The similarity of coefficients of thermal expansion enables a suitable, hermetic seal to be formed between the base 3022 and the MLP 3030, thereby preserving the integrity of the hermetic enclosure 3032. To enable adhesion between the aperture in the disk portion 3022A and the MLP 3030, a metallization layer, preferably of a tungsten alloy, titanium, or a titanium-tungsten alloy with a copper coating, is formed about a portion of the outer periphery of the MLP 3030, as indicated at 3068. The metallization layer 3068 is deposited on these surfaces using standard deposition techniques and is necessary to enable the base material to adhere to the MLP 3030. The joining of the base 3022 to the MLP 3030 can be accomplished by brazing with a copper-silver braze, or by other suitable means to form a hermetic seal therebetween.

As can be seen in FIGS. 6A and 6B, the upper insulating layer 3040 overlays a portion of the intermediate layer 3050 and the conductive pathways 3062 located thereon. As mentioned, this arrangement enables the upper insulating layer 3040 to prevent the metallic disk portion 3022A of the base 3022 from directly contacting the conductive pathways 3062 on the intermediate layer 3050. Thus, this configuration enables the conductive pathways 3062 of the intermediate layer 3050 to pass from the exterior portion 3066 to the interior portion 3064 of the header assembly 3020 without electrical or other interference from the base 3022. The thickness of the upper insulating layer 3040 is great enough as to provide sufficient separation between the conductive pathways 3062 located on the intermediate layer 3050 and the base 3022. This separation is beneficial in preventing electrical shorting of electric fields created by some of the conductive pathways 3062, which electric fields include field components that exist above the surface of the intermediate layer 3050. It is nonetheless appreciated that an upper insulating layer having differing shape, composition, or configuration from that shown in FIGS. 6A and 6B can also be utilized while still satisfying the functionality as described herein.

Also evident from FIG. 6B is the fact that the lower layer 3050 is sized as to extend a small distance farther in relation to the edge of the intermediate layer 3050 on the interior portion 3064. This enables conductive pathways located on the lower layer 3060 to readily connect to a component platform, such as a submount, located within the hermetic enclosure 3032. Further details regarding the submount are given below in connection with FIGS. 9-12.

Figure 7:
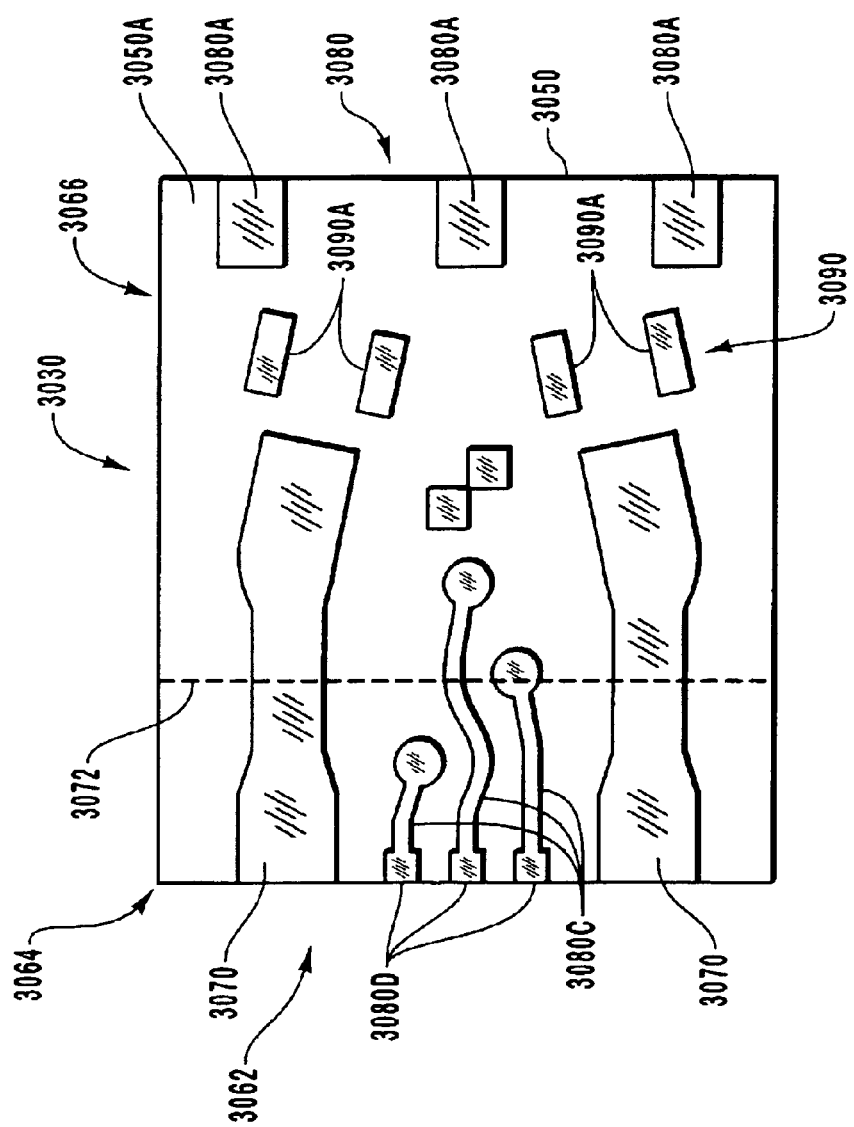
FIG. 7 is a top view of one layer of the multi-layer platform of the header assembly of FIG. 5A.

Attention is now directed to FIG. 7 in describing various details regarding the intermediate layer 3050 of the MLP 3030. As mentioned, the intermediate layer 3050, like the other layers comprising the MLP 3030, is composed of a ceramic material and has located thereon various conductive pathways 3062. The conductive pathways 3062 in the present embodiment are preferably deposited on the various layer surfaces using patterning techniques, though other pathway formation practices, such as thin film deposition, could also be acceptably used. Preferably, each of the conductive pathways 3062 comprises traces made from high temperature conductive metal(s), such as a tungsten alloy, which is then preferably covered with a gold plating. Use of a high temperature metal advantageously enables the ceramic to be produced using co-fired techniques.

Figure 8:
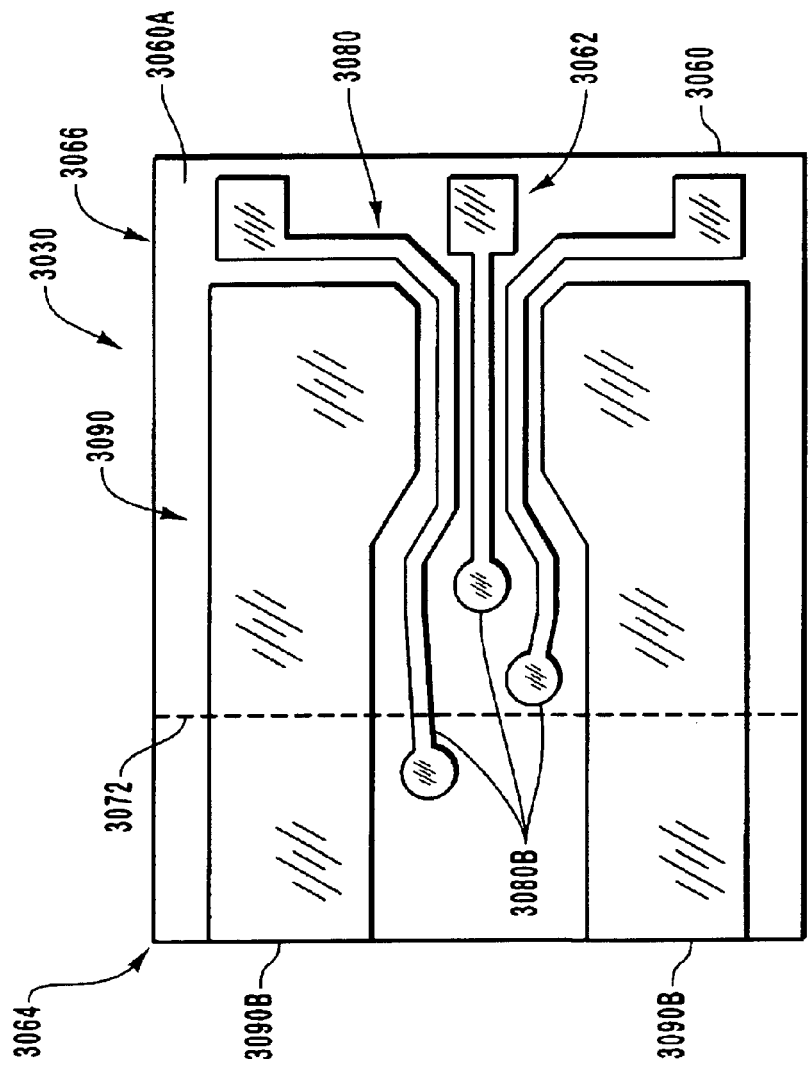
FIG. 8 is a top view of another layer of the multi-layer platform of the header assembly of FIG. 5A.

It is noted here that both the type and positioning of the conductive pathways 3062 on the various layers 3036 of the MLP 3030 is preferably precisely configured such that space on MLP surfaces is optimized and performance of the pathways and electro-optic components attached thereto is maximized. Further, the conductive pathways shown in the accompanying figures are configured according to a particular header assembly design. Thus, while the conductive pathway design to be described below in connection with FIGS. 7 and 8 illustrates one possible configuration, other configurations are also possible.

FIG. 7 shows a top surface 3050A of intermediate layer 3050 that includes various conductive pathways 3062, or portions thereof. Generally, conductive pathways 3062 (or portions thereof) of three types are shown on the top surface 3050A: high speed transmission lines, general signal lines, and ground signal lines. Each of these is described in more detail below.

Two high speed transmission lines 3070 are shown on the top surface 3050A. In the present embodiment, these lines are employed in transmitting an electrical signal from a host device (not shown) to an electro-optic component (such as a modulator or a direct modulated DFB laser) located on a submount (see FIGS. 9-12) within the header assembly 3020. As such, these lines are configured for high speed transmission of such signals. Each transmission line 3070 extends from a terminal end on the exterior portion 3066 of the intermediate layer top surface 3050A to a terminal end on the interior portion 3064 of the intermediate layer top surface. For clarity, the interior and exterior portions 3064 and 3066 of the MLP 3030 are designated in FIG. 7, separated by a superimposed dashed line 3072, which approximately corresponds to the central area of passage of the MLP 3030 through the base 3022. (Line 3072 also approximately delineates the exterior portion 3066 of the MLP 3030 from the interior portion 3064.)

The transmission lines 3070 on the intermediate layer top surface 3050A are configured for optimum transmission of electrical signals, in this case, electrical data signals for use by a laser, such as the laser 3034 in FIG. 4. In accordance with principles taught in connection with previous embodiments of the invention, the transmission lines 3070 are geometrically shaped so as to optimize their transmission properties and to improve the impedance matching between the lines themselves and the components to which they are connected, such as the laser 3034, which operates at 25 ohms impedance in this case. The shaping of each transmission line 3070 for impedance matching purposes can be seen in FIG. 9, where the width of each transmission line 3070 is narrowed near the point where it passes through the area of passage of the MLP 3030 through the base 3022, which area is again approximately indicated by the phantom line 3072.

Depending on the intended application, the high speed transmission lines 3070 can comprise one of several types of conductive traces. In the illustrated embodiment, the transmission lines 3070 are configured as microstrip traces on the intermediate layer top surface 3050A. As such, an adequate ground plane, discussed below in connection with FIG. 8, is positioned directly below each transmission line 3070, as will be discussed. In another embodiment, the high speed transmission lines 3070 can be co-planar traces, having ground planes that are laterally adjacent the traces on the same layer surface. In addition to these embodiments, high speed traces of other types, including slotline and general waveguide structures, could also be acceptably used.

In addition to the high speed transmission lines 3070, FIG. 7 shows the second type of conductive pathway utilized in the MLP 3030 of the present embodiment. Specifically, portions of general signal lines 3080 are shown on the intermediate layer top surface 3050A of FIG. 9. The general signal lines 3080 are used to provide interactive control between control circuitry located outside of the header assembly 3020 (such as on a printed circuit board located within the optical transceiver in which the TOSA 3000 is disposed) and one or more components located within the header assembly 3020. Components within the header assembly 3020 that can be interconnected using the general signal lines 3080 include, but are not limited to, thermistors, some lasers (such as EML lasers that are discussed in previous sections of the application), and optical receivers, which includes monitor photodiodes and wavelength lockers, as will be discussed below.

In particular, three general signal lines 3080 are shown in the present embodiment of the MLP 3030, each having a terminal end in the form of a contact pad 3080A positioned at an edge of the exterior portion 3066 of the intermediate layer top surface 3050A. These contact pads 3080A are configured to electrically interconnect with an appropriately configured interface, such as a flex circuit, for example, for electrical communication with components disposed outside of the header assembly 3020, such as components disposed on a transceiver printed circuit board.

Each contact pad 3080A interconnects with a second portion 3080B of each general signal line 3080 that is located on the lower layer 3060 of the MLP 3030 by way of conductive vias (not shown) defined through the intermediate layer 3050. As used herein, conductive vias such as those just mentioned can comprise, for example, conductively plated through holes defined through one or more layers of the MLP 3030, or other similar structures having the same functionality. Details concerning this second general signal line portion 3080B, shown in FIG. 8, are given further below.

Also shown on the intermediate layer top surface 3050A are portions 3080C of each general signal line 3080. Each of the three general signal line portions 3080C is formed as a conductive trace upon the intermediate layer top surface 3050A, and is interconnected with the respective general signal line portions 3080B located on the lower layer 3060 by way of conductive vias (not shown) defined through the intermediate layer 3050. Each general signal line portion 3080C terminates at a contact pad 3080D located on an edge of the intermediate layer top surface 3050A on the interior portion 3064 of the MLP 3030. Each contact pad 3080D can then be electrically connected to a component within the header assembly 3020, as will be explained.

A portion of the third type of conductive pathway 3062 is also shown in FIG. 7. Specifically, portions of four ground signal lines 3090 are shown on the intermediate layer top surface 3050A in FIG. 7. In general, the ground signal lines 3090 are responsible for providing the necessary ground planes for conductive pathways defined on the various MLP layers, and specifically, for providing a ground plane for proper operation of the high speed transmission lines 3070 described above. As shown in FIG. 7, four ground signal line contact pads 3090A are shown on the exterior portion 3066 of the intermediate layer top surface 3050A in a specified configuration. So positioned, the contact pads 3090A can electrically interface with an appropriate ground signal source provided, for instance, via a flex circuit to provide the ground signal to the MLP 3030 as required. Each ground signal line pad 3090A electrically connects with one of two ground signal line portions located on the lower layer 3060 of the MLP 3030 in a manner to be described below.

Reference is now made to FIG. 8 in describing various details concerning the lower layer 3060 of the MLP 3030, which in the present embodiment is positioned directly below the intermediate layer 3050. As shown, the lower layer 3060 includes, like the intermediate layer, several portions of conductive pathways 3062. Particularly, the lower layer 3060 features a top surface 3060A whereon the conductive pathway portions are defined. Three general signal line portions 3080B are shown defined on the lower layer top surface 3060A, beginning at the exterior portion 3066 of the MLP 3030 and extending toward the interior portion 3064 thereof. (Again, for clarity, the approximate division of interior portion 3064 of the MLP 3030 from the exterior portion 3066 is denoted by the phantom line 3072.) The terminal end of each general signal line portion 3080B that is located on the exterior portion 3066 is vertically aligned with and electrically connected to the respective contact pad 3080A located on the intermediate layer top surface 3050A by a conductive via (not shown) defined through the intermediate layer. Likewise, the other terminal end of each general signal line portion 3080B that is located toward the interior portion 3064 is vertically aligned with and electrically connected to the respective inward terminal ends of the general signal line portions 3080C located near the line 3072 on the intermediate layer top surface 3050A. This electrical connection is also made by way of conductive vias (not shown) defined through the intermediate layer.

In view of the above, then, a plurality of complete general signal line conductive pathways are defined by the general signal line portions 3080A–3080D. Indeed, FIGS. 7 and 8 depict three complete general signal lines 3080 defined in the MLP 3030 that extend from the exterior portion 3066 of the MLP to the interior portion 3064 thereof. The conductive signal pathway defined by each of these general signal lines 3080 extends first from the contact pads 3080A through conductive vias defined through the intermediate layer 3050 to the exterior portion terminal end of the signal line portions 3080B. The conductive pathway continues along each signal line portion 3080B to the other terminal end, where it extends back through the intermediate layer 3050 to the top surface 3050A thereof through conductive vias to interconnect with the terminal end nearest the line 3072 of each respective signal line portion 3080C. The conductive signal pathway then terminates at the contact pads 3080D positioned at the adjacent terminal end of each signal line portion 3080C on the edge of the interior portion 3064 of the intermediate layer top surface 3050A.

The multi-layer configuration of the general signal lines 3080 in the MLP 3030 maximizes use of the intermediate layer top surface 3050A by freeing up space (that would otherwise be occupied by a greater portion of the general signal line portions) thereon for additional interconnections to be located. This results in an increase in the number of conductive pathways that can be placed on the MLP 3030 (i.e., an increased interconnect density), which in turn increases the number or type of electronic and optoelectronic components to be utilized within the header assembly 3020.

The conductive signal pathway defined by each general signal line 3080 enables electrical communication for specified electronic and/or optoelectronic components as described here. (Similar processes are followed for the transmission lines 3070 and the ground signal lines 3090, to be explained further below.) When an electrical signal is provided to one of the contact pads 3080A on the exterior portion 3066 of the intermediate layer 3050 (using a flex circuit, for instance), it can travel unobstructed through the MLP 3030 to the interior portion 3064 within the hermetic enclosure 3032 of the header assembly 3020 (FIG. 4) using the conductive pathway of the general signal line as just described. From there, the electrical signal can proceed to any one of a variety of specified electronic or optoelectronic components disposed within the hermetic enclosure 3032. In one embodiment, the electronic and/or optoelectronic component(s) that receives the electrical signal via the general signal lines 3080 is mounted on a submount (such as submount 3033 in FIG. 4) that is positioned at least indirectly on the thermal slug 3024 to be adjacent the interior portion 3064 of the MLP 3030 within the hermetic enclosure 3032. Wire bonds, wedge-wedge bonds, ribbon bonds, submount traces and/or other appropriate interconnects can be used to electrically connect the electronic and/or optoelectronic component on the submount with one or more of the general signal line contact pads 3080D on the intermediate layer top surface 3050A. In this way, electrical communication between components located within the hermetic enclosure 3032 of the header assembly 3020 and devices external to the header assembly 3020 can be accomplished by way of the general signal lines 3080.

It is noted here that the submount used in the above example can be integrally formed with the MLP 3030, or can comprise a separate component. If the submount is configured as a separate component, replacement of one submount within the header assembly 3020 with another submount is possible, adding modularity to the TOSA package.

FIG. 8 also shows various details concerning portions of the ground signal line 3090. Particularly, two ground signal line portions 3090B are located on the lower layer top surface 3060A and are electrically interconnected with the ground signal contact pads 3090A located on the intermediate layer top surface 3050A by conductive vias (not shown) or other appropriate interconnects. The ground signal line portions 3090B occupy a substantial portion of the lower layer top surface 3060A and are aligned in the illustrated embodiment to be positioned directly below the high speed transmission lines 3070. So arranged, the ground signal line portions 3090B, when supplied with an appropriate ground signal from the ground signal line contact pads 3090A (again, such as via a flex circuit), serve as truncated ground planes for the high speed transmission lines 3070, thereby enabling their proper operation. Again, it is seen how the multi-layer configuration of the MLP 3030 enhances operation of the header assembly by enabling distribution of a ground signal in an efficient manner while still preserving space in the MLP 3030 for other types of conductive pathways.

As has already been described above in connection with the general signal lines 3080, each of the conductive pathways 3062 discussed herein, i.e., the high speed transmission lines 3070, the general signal lines, and the ground signal lines 3090, enable electrical signals to be provided to specified electronic and/or optoelectronic components located on a surface—such as the submount 3033 shown in FIG. 4—within the hermetic enclosure 3032 of the header assembly 3020 (FIG. 4). The conductive pathways 3062 can electrically connect to a corresponding component on the submount via one or more interconnects. In one embodiment, for example, the terminal end of each high speed transmission line 3070 located on the interior portion of the MLP 3030 can electrically connect with a laser, such as the laser 3034 that is positioned on the submount 3033 in FIG. 4, via wire bonds extending between the submount and the transmission line terminal end. Also, the general signal lines 3080 connect to designated components in the manner already described further above. Finally, the ground signal lines 3090 can interconnect with submount components as needed, in addition to providing ground planes for the transmission lines 3070.

Electrical signals to be delivered to the MLP 3030 from outside the header assembly 3020 are provided via a suitable interface, such as a flex circuit. The flex circuit is patterned with electrical interconnects that are configured to complementarily engage with each of the contact points of the various conductive pathways 3062 located on the exterior portion 3066 of the intermediate layer top surface 3050A. The flex circuit, in turn, is electrically connected with corresponding components located on, for instance, a printed circuit board forming, along with the header assembly 3020, part of an optical transceiver module. In this way then, electrical interconnection between internal header assembly components and external components is achieved in a manner that enables both the number and type of interconnects through the hermetic enclosure of the header assembly to be increased in a substantially efficient manner, thereby adding to header assembly performance. Further details concerning exemplary flex circuits that can be employed with embodiments of the multi-layer platform of the present invention can be found in U.S. application Ser. No. 10/409,837, entitled "Flexible Circuit for Establishing Electrical Connectivity with Optical Subassembly," filed Apr. 9, 2003, which is incorporated herein by reference in its entirety.

It should be noted that both the number and specific configuration of conductive pathways that are defined in the MLP 3030 can be altered in a variety of ways to suit other applications. Thus, the embodiments described herein are merely exemplary of the principles of the present invention and should not be considered limiting of the present invention in any way. Further details regarding the header assembly and multi-layer platform discussed herein can be found in U.S. application Ser. No. 10/625,022, entitled "Multi-layer Ceramic Feedthrough Structure in a Transmitter Optical Subassembly," and filed Jul. 23, 2003, which is incorporated herein by reference in its entirety.

Finally, it is appreciated that in one embodiment conductive traces can be configured such that they themselves form one or more components, such as integrated resistors or capacitors, for instance.

3. Laser Monitoring and Control

FIGS. 9-13 will now be referred to in describing embodiments of the present invention, which is directed to a header assembly having various optoelectronic devices included therein to optimize performance of a laser device also disposed therein. The present header assembly includes a multi-layer platform as previously described herein, which enables these laser monitoring and control devices to be advantageously employed therein, thus improving the overall operation of not only the TOSA that houses the header assembly, but the optical transceiver module in which the TOSA is located as well.

Figure 9:
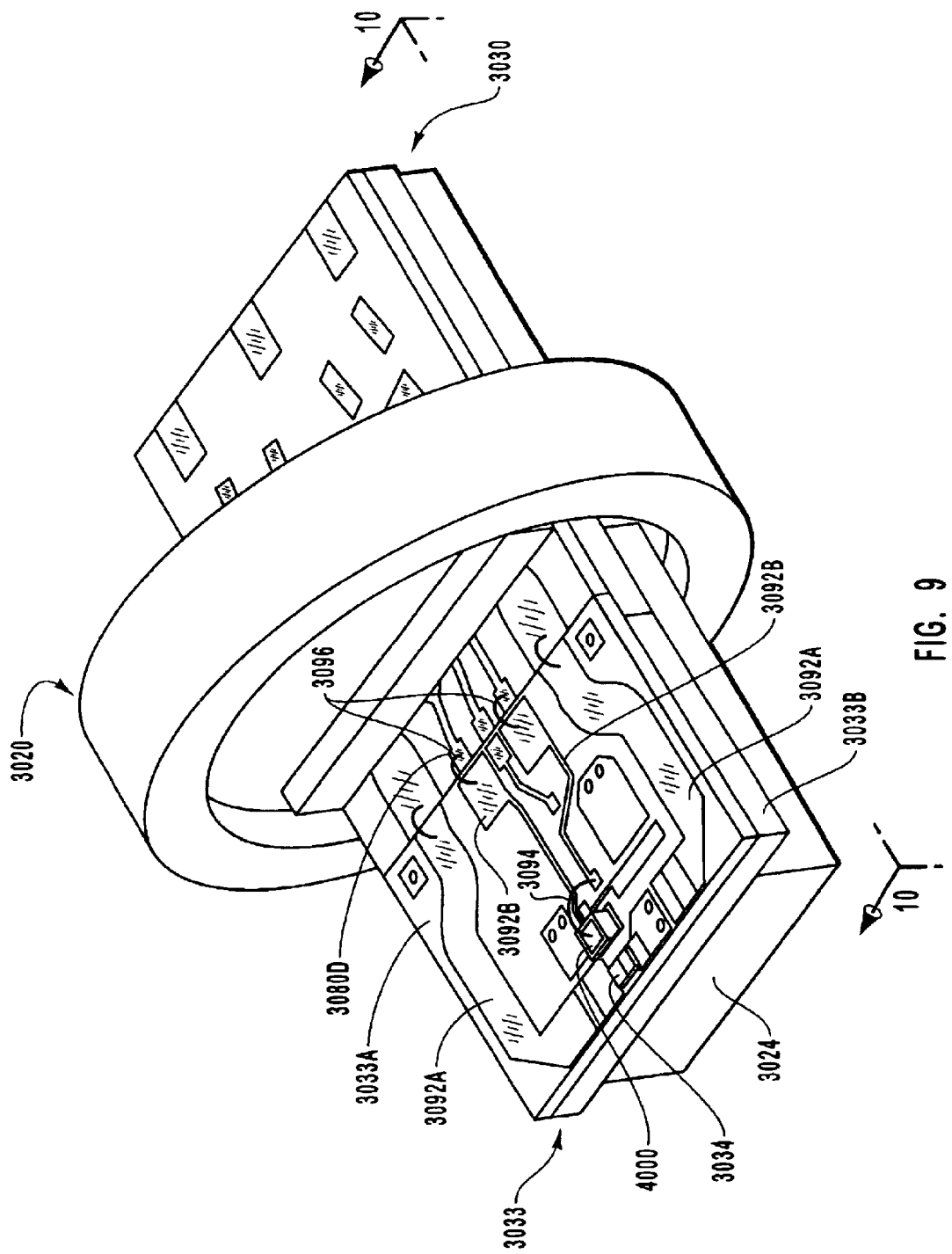
FIG. 9 is a perspective view of a header assembly and corresponding submount comprising part of a transmitter optical subassembly according to one embodiment of the present invention.

Reference is first made to FIG. 9, which shows the header assembly 3020 of which various features have been previously described in connection with FIGS. 4-8. Accordingly, the discussion to follow will focus primarily on certain selected aspects of the header assembly 3020. Note that in one embodiment of the invention, the header assembly 3020 comprises a transistor header for use within the TOSA of an optical transceiver module (not shown). However, the header assembly 3020 is not limited solely to this exemplary embodiment.

As shown, the header assembly 3020 includes the base 3022 and the MLP 3030 hermetically extending through the base to define the interior portion 3064 of the MLP and the exterior portion 3066 thereof, as previously described. The submount 3033 is also shown, including a top surface 3033A and a substrate portion 3033B. Note that the submount 3033 can assume a variety of shapes, layers and other configurations as needed for a particular application. Thus, the submount configuration shown in FIG. 9 is intended to be exemplary only, and not limiting of the present invention.

The submount 3033 is positioned in the header assembly 3020 in a specified orientation with respect to other header assembly components. In this embodiment, the submount 3033 sits atop the thermal slug 3024 and is supported thereby, though in other embodiments an alternative submount support arrangement can be used. The thermal slug 3024, as has been described, can be employed to remove heat generated by optoelectronic components located on the submount 3033 during operation of the optical transceiver. Thus, the thermal communication between the submount 3033 and the thermal slug 3024 that is achieved in this embodiment is beneficial in controlling heat buildup within the header assembly 3020.

The submount 3033 is positioned on the thermal slug 3024 as to be in electrical communication with the MLP 3030. In this way, the various conductive pathways 3062 of the MLP 3030 can electrically connect with corresponding conductive pathways 3092 located on the top surface 3033A of the submout 3033. The submount conductive pathways 3092 in turn are electrically connected to one or more optoelectronic components located on the submount top surface 3033A. In this way, electrical signals can be communicated from components located outside of the header assembly 3020 to the optoelectronic components disposed on the submount 3033.

In greater detail, FIG. 9 depicts two optoelectronic components that are positioned on the submount 3033, as mentioned above. The laser 3034 is located on the top surface 3033A of the submount 3033 and oriented to emit an optical signal through the lens assembly 3023, isolator 3006, and receptacle 3010 of the TOSA 3000 (FIG. 4). Positioned proximate the laser 3034 is an optical receiver that serves as a means for detecting a portion of the optical signal produced by the laser 3034. In accordance with the present invention, the means for detecting the optical signal of the laser in this embodiment comprises a monitor photodiode ("MPD") 4000 that can be employed to detect the power level of the laser 3034 during operation thereof, as is explained further below. The ability to position such optoelectronic components on the submount 3033 results from the relatively greater number of electrical interconnects (represented by the conductive pathways 3062) that can be introduced into the hermetic enclosure 3032 (FIG. 4) of the header assembly 3020 by virtue of the MLP 3030.

The laser 3034 in FIG. 9 is electrically connected to each of the two conductive pathways 3092A of the submount top surface 3033A. Similarly, the MPD 4000 electrically connects with two of the three conductive pathways 3092B. In the case of the MPD 4000, a conductive bottom portion of the MPD electrically connects directly to a terminal end of one of the conductive pathways 3092B on the submount 3033, while a conductive top portion of the MPD electrically connects to a terminal end of another of the conductive pathways 3092B via a wire bond 3094 extending between the terminal end and the top portion.

Each of the sets of conductive pathways 3092A and 3092B of the submount top surface 3033A is in electrical communication with corresponding conductive pathways on the intermediate layer 3050 of the MLP 3030. Specifically, each of the conductive pathways 3092A (used to power the laser 3034) electrically connects with one of the two high speed transmission lines 3070 of the MLP intermediate layer 3050. Similarly, each of the conductive pathways 3092B (at least two of which are used to power the MPD 4000) electrically connects with corresponding general signal line 3080 on the MLP intermediate layer 3050. As FIG. 9 shows, wirebonds 3096 are used to connect the conductive pathway 3092B with the terminal contact pads 3080D of the corresponding general signal lines 3080. Of course, connection schemes in addition to wire bonds could be alternatively employed, including wedge-wedge bonds, ribbon bonds, submount traces, etc. It should also be appreciated that the particular design of the conductive pathways of both the submount 3033 and the MLP 3030 can be altered from that which is illustrated here, while still preserving the laser monitoring and control functionality of the present invention.

Figure 10:
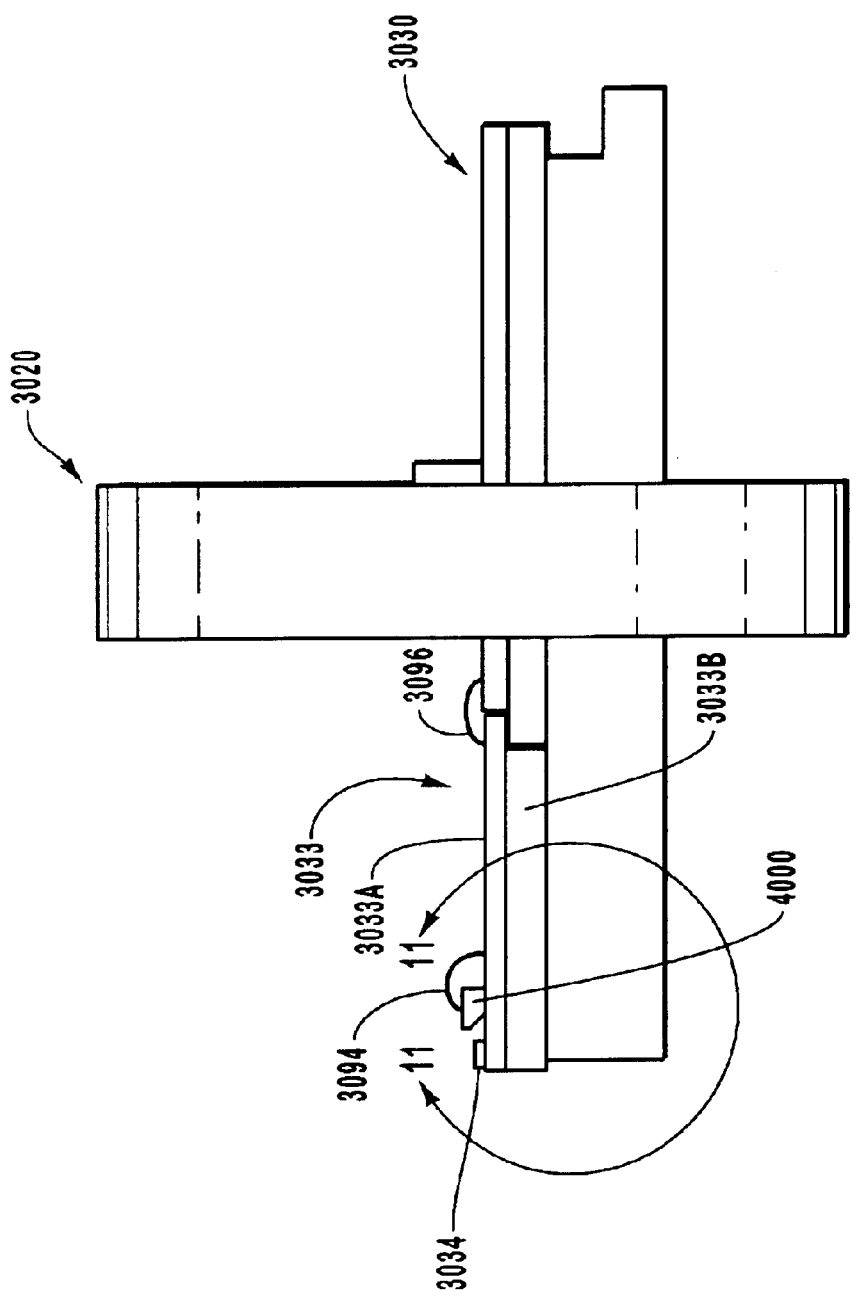
FIG. 10 is a side view of the header assembly and submount of FIG. 9.

Reference is now made to FIG. 10, which illustrates the relative positions of the laser 3034 and the MPD 4000 in the header assembly 3020. As can be seen, both the laser 3034 and the MPD 4000 are positioned near the terminal end of the submount 3033, corresponding to the interior portion 3064 of the MLP 3030. So positioned, the laser 3034 can emit its optical signal without obstruction through the TOSA 3000 for eventual transmission via a fiber optic cable (not shown). As will be seen, the MPD 4000 is also optimally positioned behind the laser to be able to monitor the optical signal thereof. Note, however, that the MPD 4000 and laser 3034 can be positioned in alternative positional relationships than those explicitly set forth herein while still complying with the aims of the present invention.

Figure 11:
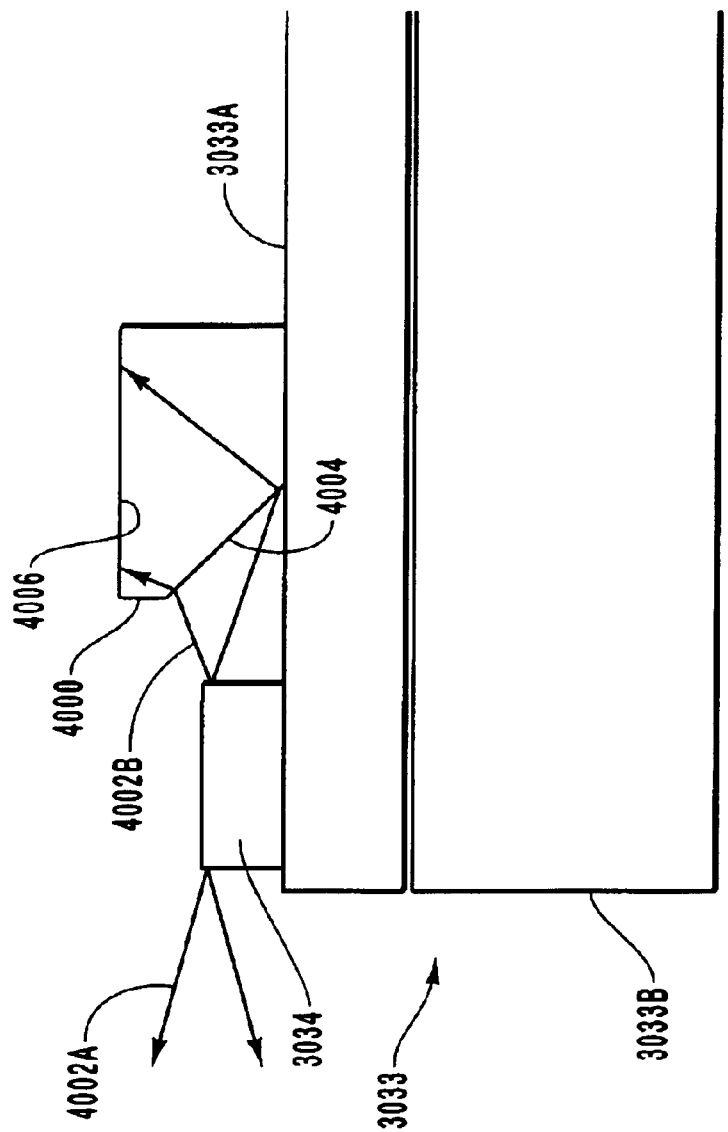
FIG. 11 is a close-up view of a portion of the header assembly of FIG. 10, showing various optoelectronic components located on the submount according to one embodiment of the present invention.

Reference is now made to FIG. 11, which is a close-up view of a portion of the header assembly 3020 wherein the wire bonds have been removed for clarity. In particular, FIG. 11 depicts various details regarding both the laser 3034 and the MPD 4000 as well as the operational relationship existing between them. The laser 3034 depicted here is an edge-emitting laser device, such as a distributed feedback ("DFB") laser. Such lasers are characterized by the manner in which they emit their coherent optical signal. As shown in FIG. 11, the laser 3034 emits a primary optical signal 4002A from a front edge, or facet, of the laser, while a secondary optical signal 4002B is emitted from a back facet of the laser.

As mentioned, the MPD 4000 is positioned with respect to the laser 3034 so as to be able to receive a portion of the optical signal emitted by the laser. In particular, the MPD 4000 is positioned behind the laser 3034 so as to be able to receive the back facet emission of the secondary optical signal 4002B during laser operation. As shown in FIG. 11, both the primary and secondary optical signals 4002A and 4002B are emitted from the laser 3034 along a slightly diverging light path. Accordingly, the MPD 4000 is placed sufficiently close to the back facet of the laser 3034 as to have a sufficient amount of light from the secondary optical signal 4002B be incident upon the MPD. Thus, while the front facet emission of the optical signal 4002A is ultimately transmitted through the various structures within the TOSA 3000 (see FIG. 4), the back facet emission of the secondary optical signal 4002B is predominantly absorbed by the MPD 4000.

It is appreciated that, while a DFB laser is shown on the submount 3033 in FIG. 11, laser devices of other types can also be utilized in accordance with the present invention. As has already been mentioned, for instance, laser devices such as EMLs can also be employed in connection with the MPD discussed here. Similarly, the MPD 4000 is but one example of an optical receiver serving as a means for detecting the optical signal of a laser that can be utilized on the submount 3033, thereby enabling the monitoring of laser performance. Indeed, optical receivers comprising varying structure and/or that are based on different operating principles than those described herein can also be utilized here.

FIG. 11 is useful in describing the operation of the MPD 4000. During operation of the TOSA 3000, the laser 3034 emits light both from its front facet in the form of the primary optical signal 4002A and from its back facet in the form of the secondary optical signal 4002B. The MPD 4000 in the illustrated embodiment includes an angled surface 4004 and is positioned such that the light comprising the secondary optical signal 4002B is incident upon the angled surface. The light is then refracted by the angled surface 4004 and is directed to an active area 4006 of the MPD 4000. As a result, the power of the laser 3034 can be determined and a signal indicating the power level can be relayed to components located outside of the header assembly 3020 via the conductive pathways spoken of above. This enables laser performance to be continuously monitored and altered, if needed, in order to optimize laser performance.

Figure 12:
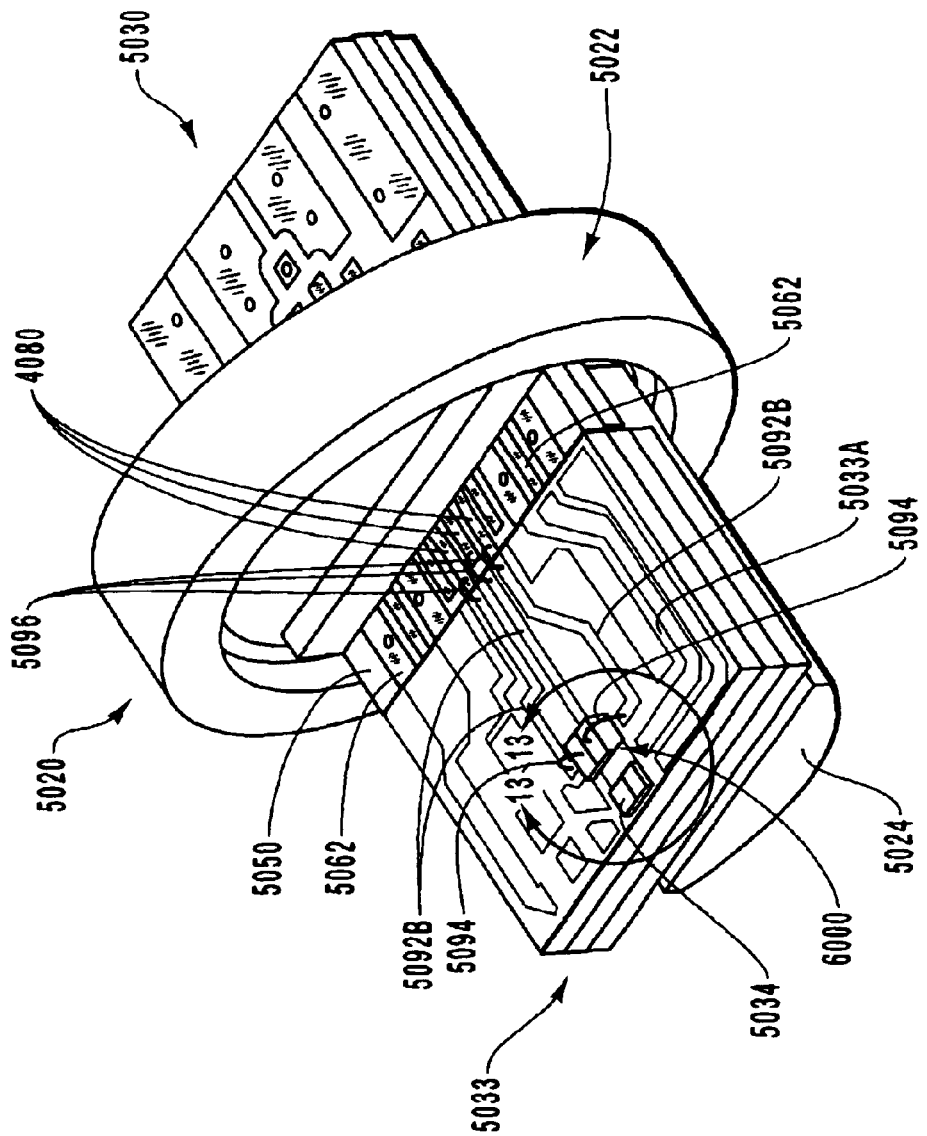
FIG. 12 is a perspective view of a header assembly and corresponding submount comprising part of a transmitter optical subassembly according to another embodiment of the present invention.
Figure 13:
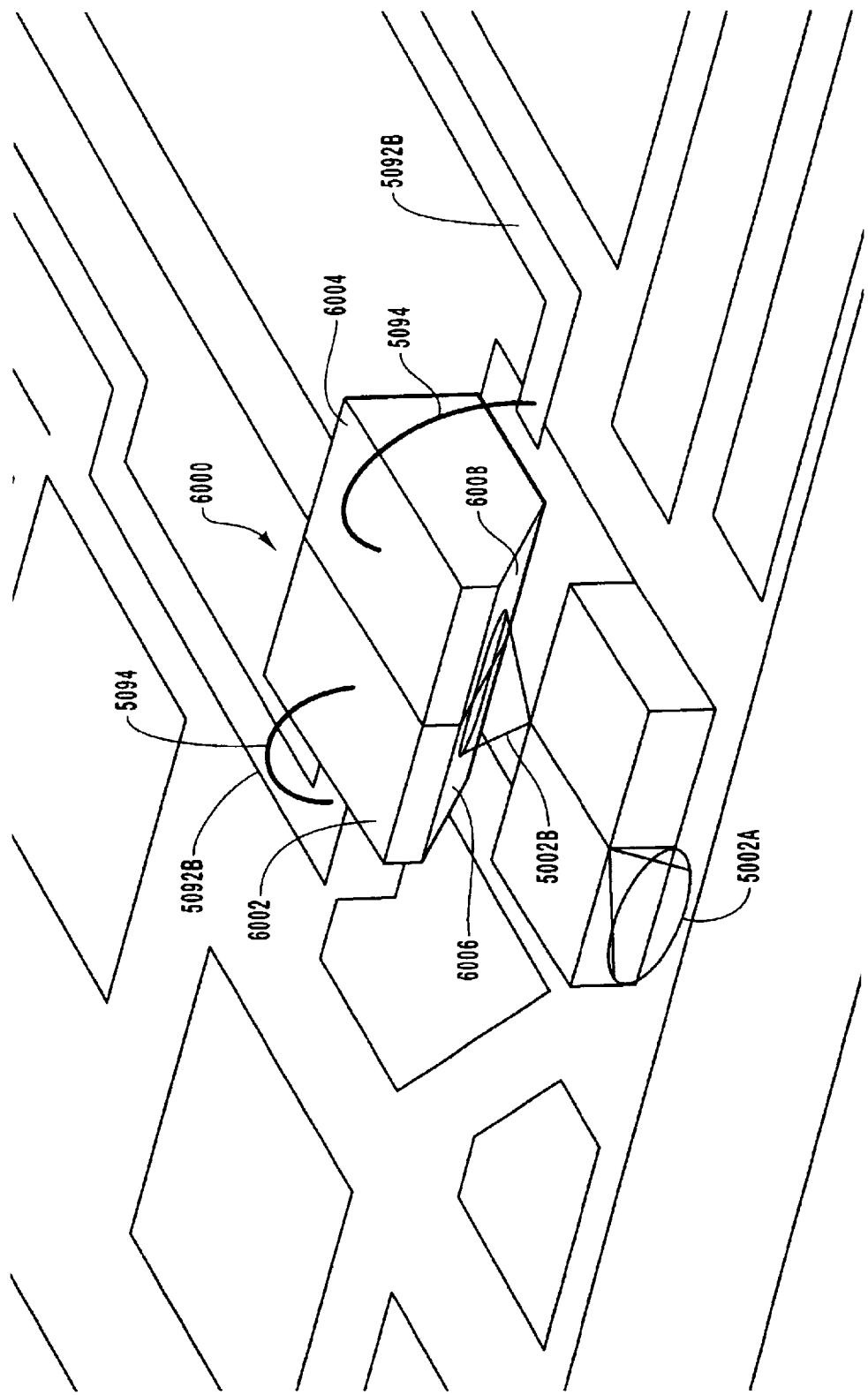
FIG. 13 is a close-up view of a portion of the submount of FIG. 12, showing various features of certain optoelectronic components.

Reference is now made to FIGS. 12 and 13 in describing another embodiment of the present invention. These figures describe additional aspects of the present invention that enable wavelength monitoring and control of the optical signal emitted by the laser during TOSA operation. Again, many features discussed in connection with the present embodiment are similar to those disclosed in previous embodiments. Correspondingly, only selected features of the present embodiment are discussed in detail here. FIG. 12 depicts a header assembly 5020 having a multi-layer platform ("MLP") 5030 extending through a base 5022. The MLP 5030 includes multiple ceramic layers on which a plurality of conductive pathways 5062 are located. A thermoelectric cooler ("TEC") 5024 also extends through the base 5022 and supports a submount 5033 adjacent an upper intermediate layer 5050 of the MLP 5030. The TEC 5024 is configured to remove heat from within the header assembly 5020, particularly, heat that is produced by optoelectronic components located on the submount 5033. Note, however, that the present embodiment can be practiced with another form of cooling device, or with no cooling device at all.

The submount 5033 is configured to support on a top surface 5033A a plurality of components including a laser 5034 and an optical receiver that serves as a means for detecting a portion of the optical signal produced by the laser. In the present embodiment, the means for detecting the optical signal comprises a wavelength locker ("WL") 6000 that is designed to stabilize the wavelength of the optical signal output by the laser 5034 during operation of the TOSA (not shown) in which the header assembly 5020 is located. As such, the WL 6000 includes two MPDs that operate in conjunction with one another to stabilize the optical signal of the laser, as will be seen further below.

Both the laser 5034 and the WL 6000 are electrically attached to the submount 5033 in a manner similar to the attachment of the laser 3034 and MPD 4000 to the submount 3033 discussed above in connection with FIGS. 9-11. In the case of the WL 6000, three electrical connections are established between the WL and the submount 5033. Specifically, bottom conductive portions of both MPDs of the WL 6000 are directly connected to one of three terminal contact pads of conductive pathways 5092B, while a top conductive portion of each MPD is connected to one of the two remaining terminal contact pads via wire bonds 5094. Of course, other connection schemes between the WL 6000 and the submount 5033 can also be employed. In turn, each of the conductive pathways 5092B of the submount 5033 electrically connect with one of four general signal lines 4080 located on the upper intermediate layer 5050 of the MLP 5030 using wire bonds 5096 or the like. So connected, the WL 6000 can be powered and can receive and send data signals to components located outside the header assembly 5020 but are connected thereto via the MLP 5030. It is appreciated that, instead of four electrical connections, three connections can be used to electrically connect the WL 6000 to the submount 5033 by having each MPD share one lead for the common signal.

Reference is now made to FIG. 13 in describing further details concerning the position and operation of the WL 6000 in relation to the laser 5034. As with the previous embodiment, the WL 6000 is proximately located behind the laser 5034 on the submount 5033. Again, the laser 5033 is an edge emitting laser, such as a DFB laser, though other laser types could alternatively be used. As before, laser 5034 produces front and back facet optical signal emission resulting in a primary optical signal 5002A from the front facet for transmission through the TOSA, and a secondary optical signal 5002B from the back facet of the laser.

The WL 6000 is comprised of dual MPDs 6002 and 6004, which are mounted side-by-side as a single unit. Each MPD 6002 and 6004 is positioned to receive a portion of the secondary optical signal produced by the back facet emission of the laser. Specifically, each MPD 6002 and 6004 is oriented such that the secondary optical signal 5002B is incident on angled faces 6006 and 6008 of the respective MPDs. In the present embodiment, one of the MPDs 6002 and 6004, in this case, MPD 6002, further includes a wavelength-dependent filter having a transmissiveness that varies according to the wavelength of light that incident upon it. So configured, the WL 6000 is capable of monitoring the wavelength of the optical signal produced by the laser 5034 and facilitating its adjustment in the case of laser drift, wherein the wavelength of the optical signal varies over time from its desired value. This is accomplished as described below.

During operation of the TOSA (not shown), the laser 5034 produces both the primary optical signal 5002A from the front laser facet for emission from the TOSA and the secondary optical signal 5002B from the back facet. Portions of the secondary optical signal 5002B from the back laser facet are received by both MPDs 6002 and 6004 via the angled faces 6006 and 6008, respectively. Upon receipt by the non-filtered MPD 6004, the respective portion of the secondary optical signal 5002B is directed by the MPD to an active area where the intensity of the optical signal is measured. The filtered MPD 6002 also receives a portion of the secondary optical signal 5002B, which first passes through the filter therein before being directed to the active area of the MPD. The amount of light that is transmitted by the filter and allowed to impinge the active area of the MPD 6002 depends on the wavelength of the secondary optical signal 5002B. Thus, the intensity of the light measured by the filtered MPD 6002 will vary from that measured by the unfiltered MPD 6004 according to the wavelength of the secondary optical signal 5002B, which is identical in wavelength to the primary optical signal 5002A. Comparison of the intensity of the secondary optical signal portion 5002B that is measured by the unfiltered MPD 6004 with that of the filtered MPD 6002 will therefore produce a ratio that can be used to determine any wavelength shift and/or the current wavelength of the primary optical signal 5002A being emitted from the laser 5034. The calculations necessary to determine this wavelength can be performed by the MPDs 6002 and 6004 themselves, or by components located outside of the header assembly that are in electrical communication with the MPDs via the MLP 5030.

Once the wavelength of the primary optical signal 5002A is known or a wavelength shift detected, it can be readily determined whether the operating parameters need to be altered in order to optimize the primary optical signal 5002A. For instance, it is generally preferable to maintain the primary optical signal 5002A at a constant wavelength to ensure its optimum quality, especially in certain applications, such as when the optical transceiver module in which the TOSA is located is employed in dense wavelength division multiplexing ("DWDM") operations. DWDM typically requires optical signals that are constant in wavelength over time.

If it is determined, as a result of operation of the WL 6000, that the wavelength of the laser 5034 needs to be modified, such modification can occur in a variety of ways. In the present embodiment, the TEC 5024 can be employed to either remove heat from or introduce heat to the header assembly 5020. As is known, laser devices generate heat as a result of producing an optical signal. This heat can alter the wavelength of light produced by the laser over time. The TEC 5024, which in the illustrated embodiment is thermally coupled to the submount 5033, can assist by absorbing heat that has been transferred to the submount from the laser. This heat, which is absorbed by a portion of the TEC 5024 that is located within the header assembly 5020, is then transferred by the TEC from within the header assembly to an exterior portion of the TEC located outside of the header assembly, where it can then be dissipated. Cooling the submount in this manner in turn cools the laser 5034, thereby enabling its wavelength to return to normal values. As mentioned, in alternative embodiments the TEC 5024 can be employed to add heat to the submount 5033 if heating of the laser 5034 is desired. Further details regarding TEC structure and operation within similarly configured header assemblies can be found in U.S. application Ser. No. 10/231, 395 entitled "Header Assembly Having Integrated Cooling Device", filed Aug. 29, 2002, which is incorporated herein by reference in its entirety.

In accordance with the present discussion, the wavelength locker described above is especially useful for tracking the primary optical signal over time to determine wavelength drift, or for stabilizing the optical signal during TOSA operation. In addition, because the wavelength locker (or MPD) in at least the above embodiments is located on the same submount, the ability to test both the laser and the wavelength locker (or MPD) before their incorporation into the hermetic portion of the header assembly is made possible. This facilitates easier testing and/or replacement of these components compared with prior methods. Ultimately, this can represent substantial cost savings in TOSA manufacturing, especially in low yield production runs where faulty devices may be relatively common.

In addition to the TEC and its operation disclosed above, other means for removing or adding heat to header assembly components can be practiced in connection with the wavelength locker disclosed above. The above example should therefore not be intended to so limit the present invention. Finally, multiple MPDs or wavelength lockers can be discretely positioned on the submount, if desired, for purposes of redundancy or task division.

In sum, the present invention employs laser monitoring and control components, such as monitor photodiodes and wavelength lockers, within a header assembly of a TOSA to control various parameters of a laser device. This functionality is facilitated through the multi-layer platform that forms part of the header assembly and provides a sufficient number of interconnects to enable laser monitoring and control components disposed within the header assembly to be electrically connected to control and other components located outside of the header assembly.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A header assembly, comprising:
   a base portion;
   a multi-layer platform ("MLP") that extends through the base portion to define interior and exterior MLP portions;
   a laser device located operably connected to the interior MLP portion, the laser device being capable of producing a coherent optical signal; and
   means for detecting a portion of the optical signal produced by the laser device, the means for detecting being operably connected to the interior MLP portion.

2. A header assembly as defined in claim 1, wherein the means for detecting detects a power level of the laser device.

3. A header assembly as defined in claim 1, wherein the means for detecting monitors the portion of the optical signal to detect a change in the wavelength of the optical signal produced by the laser device.

4. A header assembly as defined in claim 1, wherein the laser device and the means for detecting are located on a surface of a component platform, the component platform being operably connected to the interior MLP portion.

5. A header assembly as defined in claim 1, wherein the means for detecting comprises a monitor photodiode.

6. A header assembly as defined in claim 1, wherein the means for detecting comprises a wavelength locker.

7. A header assembly as defined in claim 1, wherein the MLP includes a plurality of electrically conductive pathways that electrically connect with the laser device and the means for detecting.

8. A header assembly as defined in claim 1, wherein the base portion further comprises:
   a base; and
   a cap that attaches to the base to define a hermetic enclosure, wherein the interior MLP portion is located within the hermetic enclosure.

9. An optical transceiver module, comprising:
   a shell containing a receiver optical subassembly ("ROSA") and a transmitter optical subassembly ("TOSA"), the TOSA including:
      a header assembly, comprising:
         a hermetic enclosure;
         a multi-layer platform ("MLP") that partially extends into the hermetic enclosure to define an interior portion that is contained within the hermetic enclosure and an exterior portion, the MLP including a plurality of stacked layers composed of ceramic material, wherein at least one conductive pathway is defined on at least one of the stacked layers, the at least one conductive pathway extending from the interior portion to the exterior portion of the MLP;
         a submount operably attached to a portion of the MLP and located within the hermetic enclosure, the submount having a surface on which a laser device is located, the laser device capable of producing an optical signal; and
         at least one detector positioned on the surface of the submount to receive a portion of the optical signal produced by the laser device.

10. An optical transceiver module as defined in claim 9, wherein the hermetic enclosure comprises:
    a base; and
    a cap that cooperates with the base to define the hermetic enclosure.

11. An optical transceiver module as defined in claim 10, wherein the MLP hermetically extends through the base.

12. An optical transceiver module as defined in claim 9, wherein the at least one detector is a monitor photodiode.

13. An optical transceiver module as defined in claim 9, wherein the at least one detector is a wavelength locker that includes first and second monitor photodiodes.

14. An optical transceiver module as defined in claim 13, wherein the first monitor photodiode includes a wavelength dependent filter.

15. An optical transceiver module as defined in claim 9, wherein the at least one conductive pathway of the MLP includes two conductive pathways that cooperate with conductive pathways located on the submount to electrically connect with the laser device and the at least one detector.

16. An optical transceiver module as defined in claim 15, wherein the at least one detector is electrically connected to one of the conductive pathways of the submount by wire bonds.

17. A header assembly for use in an optical transceiver module, comprising:
    a hermetic enclosure formed by a metallic base and a cap mechanically attached to the base;
    a multi-layer platform ("MLP") hermetically extending through the base to define an interior portion enclosed by the hermetic enclosure and an exterior portion located outside of the hermetic enclosure, the MLP including:
       an upper insulating layer;
       an intermediate layer having a top and bottom surface, the intermediate layer having a plurality of conductive features on its top surface;
       a lower layer having a top and bottom surface, the lower layer having
       a plurality of conductive features on its top surface; and
    a submount located within the hermetic enclosure including:
       a laser device located on a mounting surface of the submount, the laser device being electrically connected to at least one of the conductive features of the MLP; and
       at least one monitor photodiode located on the mounting surface of the submount, the at least one monitor photodiode being electrically connected to at least one of the conductive features of the MLP and positioned to intercept at least a portion of an optical signal emitted by the laser device.

18. A header assembly as defined in claim 17, wherein the conductive features of the intermediate layer of the MLP include:
    at least one conductive transmission line extending from the exterior portion to the interior portion of the MLP;
    at least one conductive ground signal line contact pad located on the exterior portion;

at least one conductive intermediate layer general signal line contact pad located on the exterior portion; and at least one conductive intermediate layer general signal line portion, the at least one general signal line portion terminating at a contact pad on the interior portion.

19. A header assembly as defined in claim 18, wherein the laser device is electrically connected to two transmission lines of the intermediate layer of the MLP.

20. A header assembly as defined in claim 19, wherein the at least one monitor photodiode is electrically connected to two intermediate layer general signal line portions of the MLP.

21. A header assembly as defined in claim 20, wherein the conductive features of the lower layer of the MLP include:

at least one conductive ground signal line portion that is electrically connected to the at least one ground signal line contact pad by at least one conductive via, the at least one ground signal line portion being aligned with the at least one transmission line on the intermediate layer; and at least one lower layer general signal line portion that is electrically connected to the at least one intermediate layer general signal line portion by a conductive via, the at least one lower layer general signal line portion also being electrically connected to the at least one intermediate layer general signal line contact pad by a conductive via.

22. A header assembly as defined in claim 21, wherein the submount is positioned proximate the interior portion of the MLP within the hermetic enclosure.

23. A header assembly as defined in claim 22, further comprising:

a thermal slug attached to the MLP.

24. A header assembly as defined in claim 23, wherein the laser device is an edge-emitting laser.

25. A header assembly as defined in claim 24, wherein the laser device if a distributed feedback laser.

26. A header assembly for use in an optical transceiver module, comprising a hermetic enclosure formed by a metallic base and mechanically attached to the base;

a multi-layer platform ("MLP") hermetically extending through the base to define an interior portion enclosed by the hermetic enclosure and an exterior portion located outside of the hermetic enclosure, the MLP including:

an upper insulating layer;

an upper intermediate layer having a top and bottom surface, the upper intermediate layer having a plurality of conductive features on its top surface;

a lower intermediate layer having a plurality of conductive features;

a lower layer having a bottom surface substantially covered by a conductive material; and a submount located within the hermetic enclosure, the submount including:

a laser device located on a mounting surface of the submount, the laser device being electrically connected to at least one of the conductive features of the MLP; and a wavelength locker located on the mounting surface of the submount, the wavelength locker being electrically connected to at least one of the conductive features of the MLP and positioned to intercept at least a portion of an optical signal emitted by the laser device.

27. A header assembly as defined in claim 26, wherein the conductive features of the upper intermediate layer include:

at least one conductive transmission line structure extending from the exterior portion and terminating on the interior portion of the MLP, the at least one transmission line structure including a co-planar transmission line positioned between two ground signal line strips;

at least one conductive upper intermediate layer general signal line extending between the exterior portion and the interior portion of the MLP; and at least one conductive signal line contact pad positioned on the exterior portion of the MLP.

28. A header assembly as defined in claim 27, wherein the laser device is electrically connected to two transmission line structures of the upper intermediate layer of the MLP.

29. A header assembly as defined in claim 28, wherein the wavelength locker is electrically connected to four upper intermediate layer general signal lines of the MLP.

30. A header assembly as defined in claim 29, wherein the wavelength locker comprises dual monitor photodiodes, one of the monitor photodiodes having a wavelength-dependent filter located therein.

31. A header assembly as defined in claim 30, wherein the submount is positioned proximate the interior portion of the MLP within the hermetic enclosure.

32. A header assembly as defined in claim 31, further comprising:

a TEC at least partially positioned within the hermetic enclosure and configured to remove heat from the submount.

33. A header assembly as defined in claim 32, wherein the laser device is a distributed feedback laser.

34. A header assembly as defined in claim 32, wherein the laser device is an externally modulated laser.

* * * * *